(12) United States Patent
Castelaz

(10) Patent No.: US 11,474,154 B1
(45) Date of Patent: *Oct. 18, 2022

(54) PERFORMING ACTIVE INTERROGATION OF BATTERY PACKS IN SITU TO OBTAIN PRECISE SOC AND SOH ESTIMATES

(71) Applicant: Motiv Power Systems, Inc., Foster City, CA (US)

(72) Inventor: James Michael Castelaz, Alameda, CA (US)

(73) Assignee: Motiv Power Systems, Inc., Foster City, CA (US)

( * ) Notice: Subject to any disclaimer, the term of this patent is extended or adjusted under 35 U.S.C. 154(b) by 772 days.

This patent is subject to a terminal disclaimer.

(21) Appl. No.: 16/232,022

(22) Filed: Dec. 25, 2018

Related U.S. Application Data

(63) Continuation of application No. 15/411,946, filed on Jan. 20, 2017, now Pat. No. 10,180,460, which is a (Continued)

(51) Int. Cl.
  *G01N 27/416* (2006.01)
  *G01R 31/367* (2019.01)
  (Continued)

(52) U.S. Cl.
  CPC .......... G01R 31/367 (2019.01); B60L 58/12 (2019.02); B60L 58/18 (2019.02); G01R 31/382 (2019.01); G01R 31/389 (2019.01); G01R 31/392 (2019.01); H02J 7/0021 (2013.01); *B60L 2200/18* (2013.01)

(58) Field of Classification Search
  CPC .......... G01R 31/3658; G01R 31/3662; G01R 31/3606; G01R 31/3624; G01R 31/3634; G01R 31/3637; G01R 31/3651; B60L 11/1861; B60L 11/1866; H02J 7/0014;
  (Continued)

(56) References Cited

U.S. PATENT DOCUMENTS

| | | | |
|---|---|---|---|
| 4,678,998 A | 7/1987 | Muramatsu | 320/136 |
| 6,778,913 B2 | 8/2004 | Tinnemeyer | 702/30 |

(Continued)

FOREIGN PATENT DOCUMENTS

| | | |
|---|---|---|
| WO | 2012/025706 | 8/2010 |

*Primary Examiner* — Yalkew Fantu
(74) *Attorney, Agent, or Firm* — Adibi IP Group, PC; Amir V. Adibi; Andrew C. Palmer

(57) ABSTRACT

A characteristic, such as State Of Health (SOH) or State Of Charge (SOC), is estimated for an Energy Storage System (ESS) by supplying a pre-determined signal to the ESS, measuring a response signal output by the ESS, and obtaining an impedance spectrum of the ESS. In one example, the ESS is one of several electrochemical battery packs of an electric vehicle. The pre-determined signal is a current signal generated by a switching power converter that transfers charge from the battery pack to other battery packs or transfers charge from the other battery packs onto the battery pack. The pre-determined signal is generated without disrupting any load supplied by the battery packs. The battery pack outputs a voltage signal in response to receiving the pre-determined current signal. A processor obtains an impedance spectrum using the current and voltage signals, and thereby obtains an SOH and SOC estimate of the battery.

20 Claims, 17 Drawing Sheets

Related U.S. Application Data continuation of application No. 13/868,075, filed on Apr. 22, 2013, now abandoned.

(60) Provisional application No. 61/635,988, filed on Apr. 20, 2012.

(51) Int. Cl.
  *H02J 7/00* (2006.01)
  *G01R 31/392* (2019.01)
  *G01R 31/389* (2019.01)
  *B60L 58/12* (2019.01)
  *B60L 58/18* (2019.01)
  *G01R 31/382* (2019.01)

(58) Field of Classification Search
  CPC ...... H02J 7/0021; H02J 7/0022; H02J 7/0026; H02J 7/0029
  USPC .................................. 324/426, 433
  See application file for complete search history.

(56) References Cited

U.S. PATENT DOCUMENTS

| | | |
|---|---|---|
| 8,264,202 B2 | 9/2012 | Sahu et al. ............... 320/132 |
| 8,269,502 B2 | 9/2012 | Desprez et al. ........... 324/427 |
| 8,332,169 B2 | 12/2012 | Kang et al. ............... 702/63 |
| 2002/0000790 A1 | 1/2002 | Sano et al. ............... 320/162 |
| 2010/0188043 A1 | 7/2010 | Kelty et al. ............... 320/109 |
| 2010/0237830 A1 | 9/2010 | Castelaz et al. ........... 320/118 |
| 2011/0089760 A1 | 4/2011 | Castelaz et al. ........... 307/25 |
| 2011/0296218 A1 | 12/2011 | Kim et al. ............... 713/323 |
| 2012/0078552 A1 | 3/2012 | Mingant et al. ........... 702/63 |
| 2012/0223670 A1 | 9/2012 | Kinjo et al. ............... 320/103 |
| 2013/0229156 A1 | 9/2013 | Brandon et al. ........... 320/136 |

ELECTRIC VEHICLE WITH FOUR ENERGY STORAGE
SYSTEMS (ESSs)

IMPEDANCE SPECTRUM OF BATTERY OVER TIME

BATTERY INTERNAL RESISTANCE

BATTERY CAPACITY

CONVENTIONAL EIS SYSTEM

GENERATING A PRE-DETERMINED SIGNAL

MEASURE RESPONSE SIGNAL OUTPUT BY
THE BATTERY PACK

DETERMINE VALUE INDICATIVE OF SOH USING ESTIMATION OF IMPEDANCE SPECTRUM

ANALYZE REGION OF THE ESTIMATION OF THE IMPEDANCE SPECTRUM TO DETECT FAULT IN BATTERY PACK

DETERMINE CHARACTERISTIC OF BATTERY PACK BY
GENERATING A SINUSOIDAL CURRENT SIGNAL

DETERMINE CHARACTERISTIC OF BATTERY PACK BY
DETERMINING INTERNAL RESISTANCE OF BATTERY PACK

DETERMINE VALUE INDICATIVE OF SOH USING
INTERNAL RESISTANCE

DETERMINE VALUE INDICATIVE OF SOC USING INTERNAL RESISTANCE

PERFORMING ACTIVE INTERROGATION OF BATTERY PACKS IN SITU TO OBTAIN PRECISE SOC AND SOH ESTIMATES

CROSS REFERENCE TO RELATED APPLICATIONS

This application is a continuation of, and claims the benefit under 35 U.S.C. § 120 from, nonprovisional U.S. patent application Ser. No. 15/411,946, entitled "Performing Active Interrogation Of Battery Packs In Situ To Obtain Precise SoC And SoH Estimates," filed Jan. 20, 2017, now U.S. Pat. No. 10,180,460. U.S. patent application Ser. No. 15/411,946 in turn is a continuation of, and claims the benefit under 35 U.S.C. § 120 from, nonprovisional U.S. patent application Ser. No. 13/868,075, entitled "Performing Active Interrogation Of Battery Packs In Situ To Obtain Precise SoC And SoH Estimates," filed Apr. 22, 2013. U.S. patent application Ser. No. 13/868,075 in turn claims the benefit under 35 U.S.C. § 119 of U.S. provisional application Ser. No. 61/635,988, entitled "System And Method For Determining Battery Pack Health In Situ," filed Apr. 20, 2012. The entire subject matter of the aforementioned patent documents is incorporated herein by reference.

TECHNICAL FIELD

The present disclosure relates generally to Battery Management Systems (BMSs), and more particularly to estimating State of Charge (SOC) and State of Health (SOH) of a battery pack.

BACKGROUND INFORMATION

Clean energy systems such as electric vehicles and electrical power grids require energy storage mechanisms. An Energy Storage System (ESS) is typically used in such a system to store energy. In order to operate efficiently, the system requires estimations of certain characteristics of the ESS. Of particular interest are State Of Health (SOH) and State Of Charge (SOC). The SOH is a characteristic of the ESS that indicates the state of degradation of the ESS. The SOC is a characteristic of the ESS that indicates the amount of charge or energy remaining in the ESS. Although methods exist for determining the SOH and SOC characteristics of single battery cells, these techniques are often ineffective in determining the SOH and SOC characteristics of battery packs containing hundreds of cells. A more effective technique for determining the SOH and SOC characteristics of battery packs is desired.

SUMMARY

A characteristic, such as State Of Health (SOH) or State Of Charge (SOC), is estimated for an Energy Storage System (ESS). The ESS is part of a plurality of ESSs. In one embodiment, the ESS is an electrochemical battery pack (referred to as "battery pack"), and the plurality of battery packs are part of a powertrain of an electric vehicle. Each of the battery packs includes a plurality of electrochemical cells and a Battery Management System (BMS). Each battery pack is coupled to a battery controller that includes a switching power converter, a voltage sensing circuit, and a processor. The power train also includes a motor and a motor controller. Each of the battery pack controllers and the motor controller are coupled to a power bus and a communication bus. The power bus is used to transfer charge between the components. A Power Control Unit (PCU) controls the overall powertrain system by communicating with each of the controllers via the communication bus.

The SOH is a characteristic of the battery pack that indicates the state of degradation of the battery pack. During the lifetime of the battery pack, the battery pack undergoes charge and discharge cycles. Such cycles cause the battery pack to degrade because of the physical and chemical variations that occur while the battery pack is operating. The SOH is usually represented as a percentage value corresponding to: the battery pack's total capacity at a given time, the number of charge and discharge cycles remaining, or the likelihood the battery pack will fail within a given time. A SOH of 100% would indicate a new battery, whereas a SOH of 0% would indicate the battery is inoperable. The SOH characteristic is useful to determine when a battery pack should be replaced with a newer battery pack to improve efficiency and overall range of the electric vehicle.

The SOC is a characteristic of the battery pack that indicates the amount of charge remaining in the battery pack. The SOC is typically represented as a percentage value. A SOC characteristic of 100% would indicate the battery pack is fully charged, whereas a SOC of 0% would indicate the battery pack no longer has any usable charge. The SOC characteristic is valuable to estimate the amount of range left in the electric vehicle.

During operation, the PCU determines that the SOH characteristic is to be estimated for one of the battery packs. This is also referred to as "testing" the battery pack. The SOH characteristic of the battery pack is estimated by generating a pre-determined signal using the battery pack and the switching power converter. The pre-determined signal may be a constant current signal, an impulse current signal, a sinusoidal current signal, a step current signal, or a triangular current signal. The pre-determined signal is generated as a result of the switching power converter supplying current to the battery pack (referred to as "charging") or the battery pack supplying current to the switching power converter (referred to as "discharging"). A single pre-determined current signal may be generated, or a plurality of pre-determined current signals may be generated.

The pre-determined current signal is generated by sinking current from the battery pack being tested onto the other battery packs, sourcing current from the other battery packs onto the battery pack being tested, or sinking and sourcing current between the battery pack being tested and the other battery packs. Charge transfers between the battery packs through the switching power converters within the battery pack controllers. Whether the pre-determined current signal is supplied by charging or discharging the battery pack, the electrical load or source continues to receive or supply power from or to the DC power bus and maintain complete functionality during the time interval that the SOH is being estimated. Other battery packs not under test are controlled to adjust their power delivery to the load or power receipt from the source to compensate for the battery pack under test. In another example, a separate hardware device is used to generate the pre-determined signal, such a Silicon Controlled Rectifier (SCR), or a power transistor and a capacitor.

In response to receiving the pre-determined current signal, the battery pack outputs a response signal in the form of a voltage signal. The voltage signal is measured by the voltage sensing circuitry within the battery pack controller that detects the voltage present between two terminals of the battery pack. The measured voltage signal represents a time-domain response signal. In another embodiment, the voltage signal is measured by the BMS.

Next, the processor performs signal processing operations on the measured voltage signal and the pre-determined current signal to determine an estimation of an impedance spectrum of the battery pack. The signal processing involves Fourier transform operations, such as a Discrete Fast Fourier Transform (DFFT). Standard Spectral Density Estimation techniques may be preferred if the presence of noise is significant. The result of such signal processing operations is an estimation of the impedance spectrum of the battery pack. The impedance spectrum estimation provides resistance (real component of impedance) and reactance (imaginary component of impedance) information of the battery pack across various frequencies.

Next, the processor uses the resistance and reactance information obtained from the impedance spectrum estimate of the battery pack to determine a value indicative of the SOH or SOC characteristic of the battery pack. In one embodiment, the processor uses a pre-determined equation to process the current and voltage information. The pre-determined equation may include weighted values that are empirically determined through lab testing of a similar battery pack. In another embodiment, the processor performs a Complex Nonlinear Least Squares (CNLS) operation to the impedance spectrum estimate information to determine parameter values for an equivalent circuit model of the battery pack. In yet another embodiment, the processor performs a direct comparison of regions of the impedance spectrum estimate of the battery pack to determine the value indicative of SOH and predict failures in the battery pack. In yet another embodiment, the processor uses one of the above methods to estimate SOC and uses one of the above methods to estimate SOH, thus determining SOC and SOH from a single set of impedance spectrum estimation data.

In accordance with another novel aspect, the processor may estimate the SOC characteristic or the SOH characteristic by estimating the internal resistance of the battery pack. A pre-determined constant current signal is generated using the battery pack to be tested and the switching power converter. The constant current signal is generated as a result of using the switching power converter to transfer charge between the battery pack and the power bus. Next, a voltage between two terminals of the battery pack is measured using the voltage sensing circuit. Next, the difference between the measured voltage and the Open Circuit Voltage (OCV) is calculated to obtain the change in voltage. Next, the internal resistance is calculated by dividing the change in voltage by the constant value of the constant current signal. Next, the processor performs a look-up table operation using the determined internal resistance. If the battery pack is of a type that exhibits a correlation between internal resistance and the SOH characteristic and the estimation of the SOC characteristic is known, then the processor performs a look-up operation on a SOH look-up table. If, on the other hand, the battery pack is of a type that exhibits a correlation between internal resistance and the SOC characteristic, and the estimation of the SOH characteristic is known or the internal resistance changes minimally with the SOH characteristic, then the processor performs a look-up operation on a SOC look-up table. The SOH table and the SOC table are also determined empirically for each of these different battery types.

In another embodiment, the ESS is an electrochemical battery pack, and the plurality of electrochemical battery packs are part of an electrical power grid. A controller utilizes the methods described above to determine the SOH characteristic and the SOC characteristic of any individual battery pack. The SOH and SOC characteristics are determined without disrupting any electrical load or source that sources or sinks current from or to a power line of the power grid that is connected to the plurality of electrochemical battery packs.

The foregoing is a summary and thus contains, by necessity, simplifications, generalizations and omissions of detail; consequently it is appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
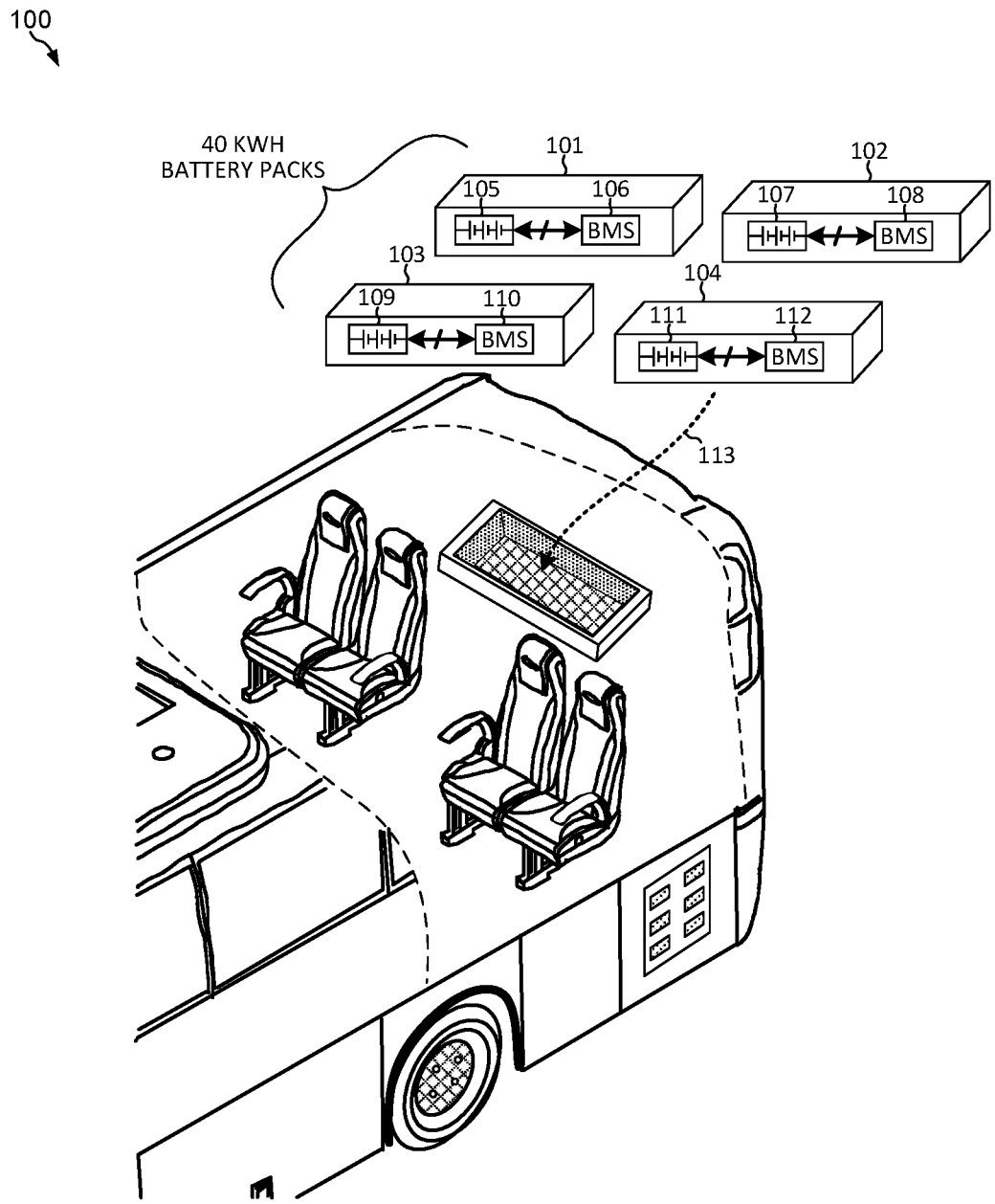
FIG. 1 is a perspective diagram of a portion of an electric vehicle 100.

FIG. 1 is a perspective diagram of a portion of an electric vehicle 100. The electric vehicle 100 is an electric twenty-passenger shuttle bus that utilizes an entirely electric powertrain. Shuttle bus 100 includes four Energy Storage Systems (ESSs) 101-104 that store electrical energy utilized by the power train for operating shuttle bus 100. In this example, each of the ESSs 101-104 is an electrochemical battery pack that stores a maximum of forty kilowatt hours. (The term "battery pack" is used to refer to an electrochemical battery pack.) Shuttle bus 100 has a range of approximately one-hundred miles when all of the battery packs 101-104 are fully charged. However, the range of the shuttle bus 100 is dependent on various factors, such as temperature, age of the battery packs, and the rate at which energy is discharged from the battery packs, among other factors.

The battery packs 101-104 each comprises a plurality of electrochemical storage cells (referred to as "cells") and a Battery Management System (BMS). Battery pack 101 comprises a plurality of cells 105 and BMS 106. Battery pack 102 comprises a plurality of cells 107 and BMS 108. Battery pack 103 comprises a plurality of cells 109 and BMS 110. Battery pack 104 comprises a plurality of cells 111 and BMS 112. Each of the cells 105, 107, 109 and 111 is of a lithium-ion chemistry type. Although each of the cells depicted in FIG. 1 include cells connected in series, in actuality the cells may be connected in series, in parallel, or in combination of both series and parallel. Various types of battery chemistries and cell configurations exist and the type of chemistry and configuration that is selected is largely dependent on the requirements of the battery pack. Battery packs 101-104 have a capacity of forty kilowatt hours, however, battery packs having a capacity as low as five kilowatts may be selected depending on the application.

The BMS included in each of the battery packs 101-104 provides a mechanism for measuring the voltage, SOC and charge or discharge of the cells. The BMS may provide circuitry for protecting the cells from charging or discharging beyond the limits supported by the cells. The BMS may also include circuitry that performs cell balancing to distribute charge equally among all the cells, or to draw excess power from cells to bring them into balance with each other. Charge balancing tends to prolong battery life because no single cell is overcharged to the extent that it becomes damaged. Other types of BMSs include robust features whereas other BMSs include less functionality.

Battery pack manufacturers provide battery packs in a single product that includes both the plurality of cells and the BMS, such as battery packs 101-104. In the example of FIG. 1, the powertrain of shuttle bus 100 supports conventional and widely available battery packs to store energy, rather than requiring specially-designed battery packs that are more costly. In addition, battery packs may be easily replaced with new battery packs without requiring significant changes to the powertrain. The low-cost integration of conventional battery packs with the powertrain of shuttle bus 100 is shown by dotted line and arrow 113. In one embodiment, each of battery packs 101-104 is a CleanBat available from Dow Kokam, 2700 S. Saginaw Road, Midland, Mich. 48640. In another embodiment, each of battery packs 101-104 is a Core Pack available from A123 Systems, LLC.

Figure 2:
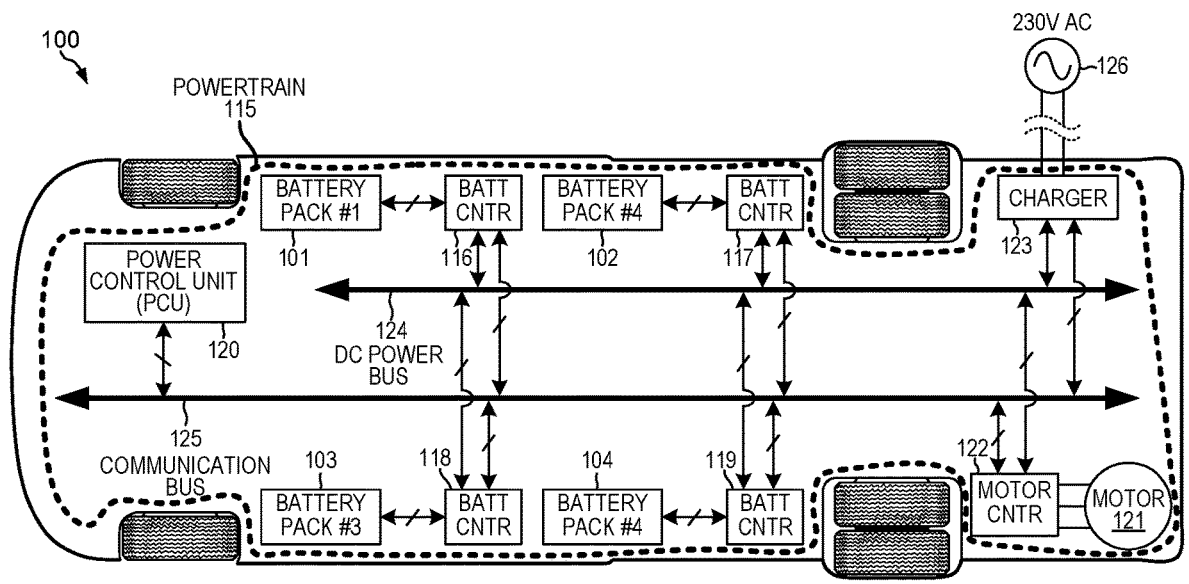
FIG. 2 is a simplified conceptual diagram of the electric powertrain 115 of the shuttle bus 100.

FIG. 2 is a simplified conceptual diagram of the electric powertrain 115 of the shuttle bus 100. Powertrain 115 includes the battery packs 101, 102, 103 and 104, battery controllers 116, 117, 118 and 119, a Power Control Unit (PCU) 120, a three-phase electric motor 121, a motor controller 122, an electrical charging device 123, a Direct Current (DC) electrical power bus 124, and a communication bus 125. Battery controllers 116-119 communicate with the BMSs (not shown) within the battery packs and also control current flow between the battery packs and the DC power bus 124. Alternating Current (AC) source 126 provides electrical power to charger 123, and charger 123 in turn converts the AC power into DC power and supplies the DC power onto DC power bus 124 for charging the battery packs 101-104.

Components of powertrain 115 communicate with other components via communication bus 125. PCU 120 controls overall system operation of the powertrain 115 via communication bus 125. The PCU 120 also controls the manner in which each of battery packs 101-104 supplies power to and receives power from the DC power bus 124. The PCU 120 communicates with motor controller 122 to control operation of motor 121. Components comply with the Controller Area Network (CAN) protocol standard for communicating across bus 125. In other examples, the FlexRay protocol standard is used to communicate across bus 125.

Components of powertrain 115 transfer charge between each other via DC power bus 124. The PCU 120 is operable to control the battery controllers 116-119 such that charge is transferred between the battery packs 101-104. The PCU 120 is also operable to control the motor controller 122 to supply power from battery packs 101-104 to motor 121 via the DC power bus 124.

Figure 3:
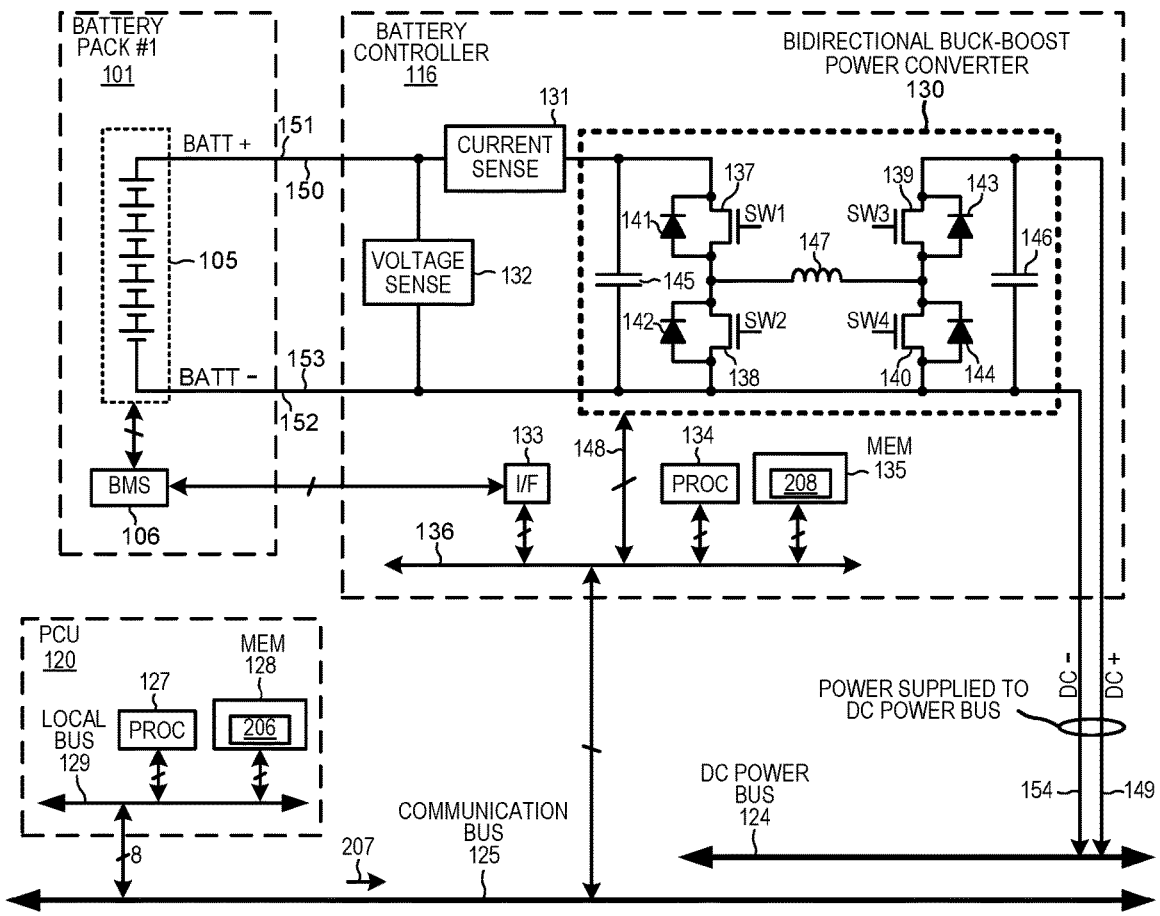
FIG. 3 is a more detailed diagram of battery pack 101, battery controller 116 and PCU 120.

FIG. 3 is a more detailed diagram of battery pack 101, battery controller 116 and PCU 120. PCU 120 comprises processor 127, memory 128 and local bus 129. Memory 128 is a processor-readable medium that is readable by the processor 127. Battery controller 116 comprises a switching power converter 130, a current sense circuit 131, a voltage sense circuit 132, interface circuit 133, processor 134, memory 135, and local bus 136. Memory 135 is a processor-readable medium that is readable by the processor 134. The battery pack 101 comprises the plurality of cells 105 and the BMS 106.

In this example, the switching power converter 130 is a bi-directional buck-boost power converter. The bi-directional buck-boost power converter 130 comprises N-channel Metal Oxide Semiconductor Field-Effect Transistors (MOSFETs) 137, 138, 139 and 140, diodes 141, 142, 143 and 144, capacitors 145 and 146, and inductor 147. Transistors 137, 138, 139 and 140 need not be MOSFET devices and may be realized as Insulated-Gate Bipolar Transistors (IGBTs). The processor 134 controls the bi-directional buck-boost power converter 130 by supplying digital logic control signals SW1, SW2, SW3 and SW4 to converter 130 via conductors 148. Digital logic control signal SW1 is supplied to a gate of transistor 137. Digital logic control signal SW2 is supplied to a gate of transistor 138. Digital logic control signal SW3 is supplied to a gate of transistor 139. Digital logic control signal SW4 is supplied to a gate of transistor 140.

In operation, processor 134 controls digital logic levels of the digital control signals SW1-SW4 such that battery pack 101 is charged or discharged. If battery pack 101 is to be charged, processor 134 of the battery controller 116 controls digital logic controls signals SW1, SW2, SW3 and SW4 to appropriate digital logic levels causing current to flow from DC power bus 124 through conductor 149 through bi-directional buck-boost power converter 130, through current sense circuit 131, through conductor 150 and onto battery pack terminal 151. If, on the other hand, battery pack 101 is to be discharged, processor 134 of the battery controller 116 controls digital logic controls signals SW1, SW2, SW3 and SW4 to appropriate digital logic levels causing current to flow from battery pack terminal 152, through conductor 153, through bi-directional buck-boost power converter 130, through conductor 154 and onto DC power bus 124. The digital logic levels and timing of the switching of the controls signals SW1, SW2, SW3 and SW4 depend upon whether current is flowing from a higher potential to a lower potential in which case the power converter 130 operates in buck mode, or whether current is flowing from a lower potential to a higher potential in which case power the converter 130 operates in boost mode. For additional information on the structure and operation of powertrain 115 and how PCU controls and communicates with the battery controllers 116-119 and motor controller 122, see: 1) U.S. Patent Publication No. 2011/0089760, entitled "System And Method For Managing A Power System With Multiple Power Components", filed Oct. 20, 2010, by Castelaz et al., and 2) U.S. Patent Publication No. 2010/0237830, entitled "System and Method for Balancing Charge Within a Battery Pack", filed Mar. 23, 2010, by Castelaz et al. (the subject matter of each of these patent documents is incorporated herein in its entirety).

Figure 4:
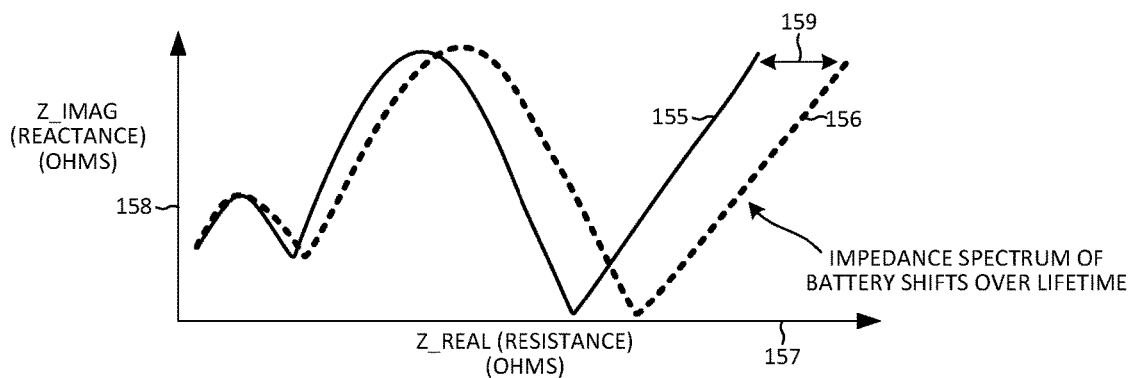
FIG. 4 is a diagram showing how an impedance spectrum for an electrochemical battery shifts over a batteries lifetime.

FIG. 4 is a diagram showing how an impedance spectrum for an electrochemical battery shifts over a batteries lifetime. Reference numeral 155 identifies a first impedance spectrum of a typical electrochemical battery having a Lithium-based chemistry. Reference numeral 156 identifies a second impedance spectrum of the same electrochemical battery after aging. The term "aging" refers to the electrochemical battery undergoing charge and discharge cycles, typically on the order of hundreds of cycles. Reference numeral 157 identifies the real-axis that represents the resistance (or real component of the impedance), and reference numeral 158 identifies the imaginary-axis that represents the reactance (or imaginary component of the impedance). The impedance spectrums 155 and 156 are represented as Nyquist plots. Each point on the Nyquist plot corresponds to a frequency. At higher frequencies, the variance in resistance over the battery's lifetime is more pronounced than at lower frequencies. This phenomenon is identified by reference numeral 159.

Figure 5:
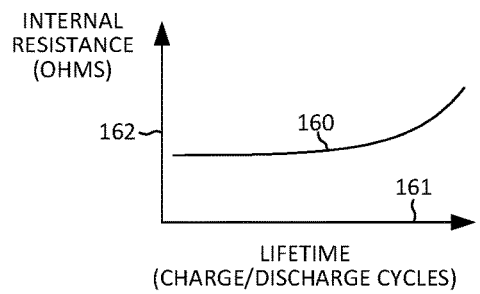
FIG. 5 is a plot 160 of internal resistance as a function of lifetime of a typical electrochemical battery having a Lithium-based chemistry.

FIG. 5 is a plot 160 of internal resistance as a function of lifetime of a typical electrochemical battery having a Lithium-based chemistry. Reference numeral 161 identifies the independent axis representing lifetime (charge/discharge cycles), and reference numeral 162 identifies the dependent axis representing internal resistance (ohms). As indicated by plot 160, the internal resistance of the electrochemical battery increases over the battery's lifetime.

Figure 6:
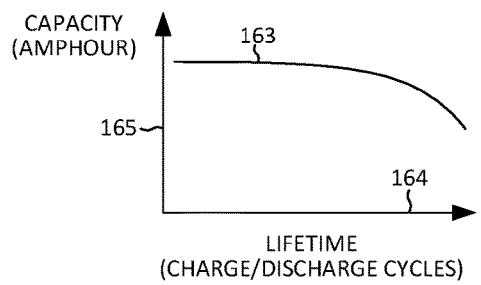
FIG. 6 is a plot 163 of charge capacity as a function of lifetime of a typical electrochemical battery having a Lithium-based chemistry.

FIG. 6 is a plot 163 of charge capacity as a function of lifetime of a typical electrochemical battery having a Lithium-based chemistry. Reference numeral 164 identifies the independent axis representing lifetime (charge/discharge cycles), and reference numeral 165 identifies the dependent axis representing charge capacity (ampere-hours). As indicated by plot 163, the internal resistance of the electrochemical battery increases over the battery's lifetime.

Figure 7:
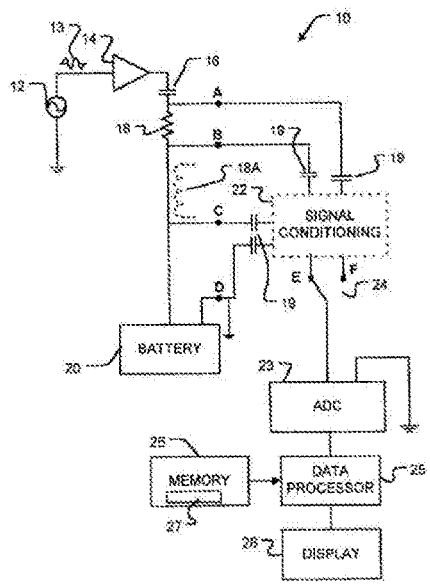
FIG. 7 is a diagram of a conventional battery tester 10 for generating an impedance spectrum of an electrochemical battery.

FIG. 7 is a diagram of a conventional battery tester 10 for generating an impedance spectrum of an electrochemical battery. Battery tester 10 utilizes a signal generator 12 to generate and supply an excitation signal 13 to the battery 20. Battery tester 10 measures the voltage between terminals of battery 20 and the current passing into battery 20. The data resulting from these measurements is then used to determine an impedance of the battery 20. Several disadvantages exist with battery tester 10 and other conventional techniques for determining impedance. One disadvantage is that battery tester 10 requires circuitry of signal generator 12 to generate the excitation signal. This increases the cost and complexity of determining the impedance of a battery in a system. Moreover, such conventional systems are ideal for testing single cells, but ineffective for testing battery packs containing many cells because parasitic losses in battery pack connections introduce too much noise and attenuation for the small excitation signals that are used. For additional information on the structure and operation of devices conventionally used to obtain an impedance spectrum for electrochemical batteries, see: 1) U.S. Pat. No. 6,778,913, entitled "Multiple Model Systems And Methods For Testing Electrochemical Systems", filed on Apr. 29, 2002, by Tinnemeyer; and 2) U.S. Patent Publication No. 2012/0078552, entitled "In-Situ Battery Diagnosis Method Using Electrochemical Impedance Spectroscopy", filed Sep. 22, 2011, by Mingant et al. (the subject matter of each of these patent documents is incorporated herein in its entirety).

Figure 8:
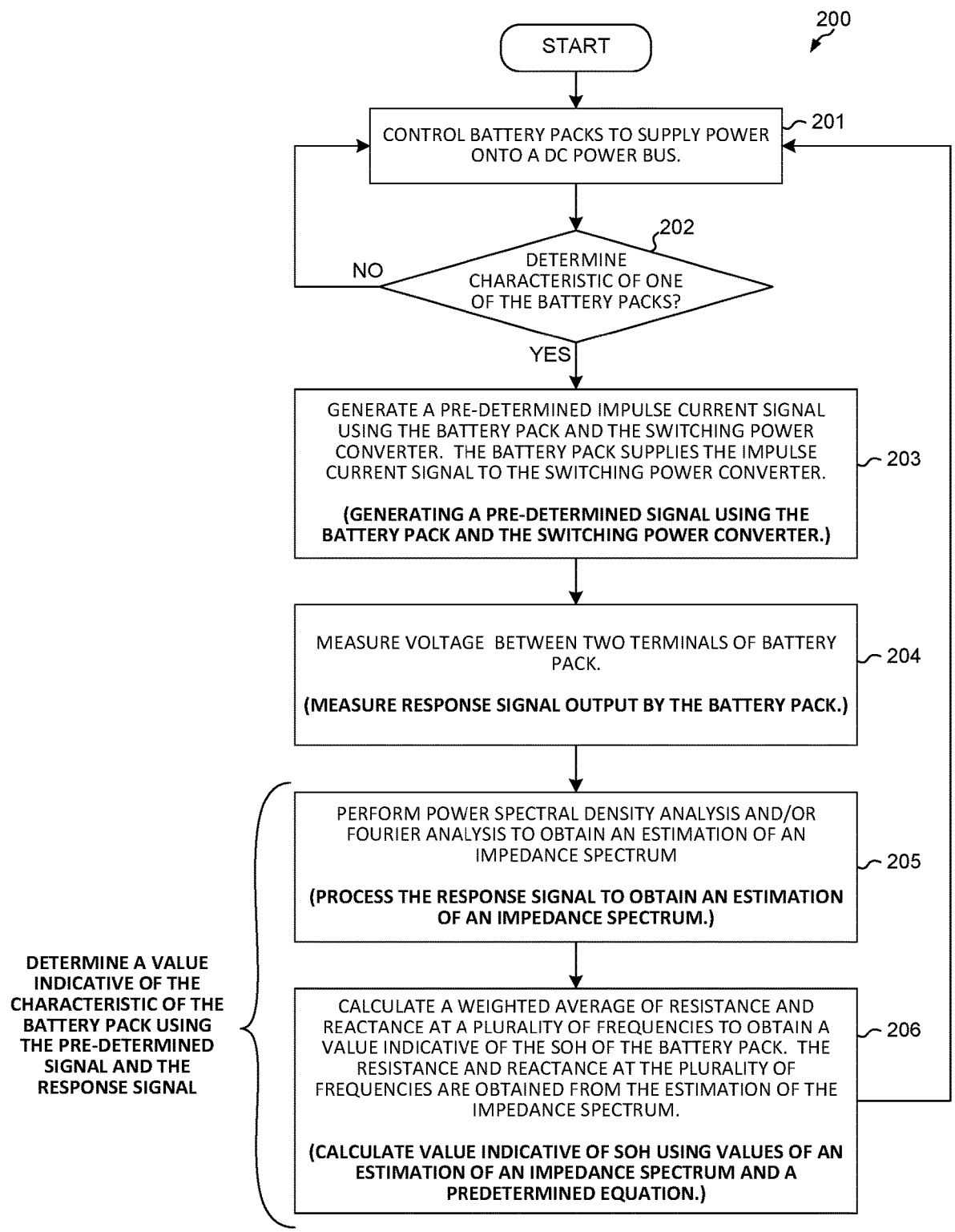
FIG. 8 is a flowchart of a method 200 in accordance with one novel aspect.

FIG. 8 is a flowchart of a method 200 in accordance with one novel aspect. In one embodiment, battery controller 116 is realized as a single integrated circuit that performs method 200 to obtain a characteristic of one of the battery packs 101-104 of the powertrain 115 in FIG. 2. In the example of FIG. 8, the characteristic to be obtained is an estimation of the State Of Health (SOH) of the battery pack. The SOH of the battery pack indicates the state of degradation of the battery pack. During the lifetime of the battery pack, the battery pack undergoes charge and discharge cycles. Such cycles cause the battery pack to degrade because of the physical and chemical variations that occur while the battery pack is operating. The SOH is usually represented as a percentage corresponding to: the battery pack's total capacity at a given time, the number of charge and discharge cycles remaining, or the likelihood the battery pack will fail within a given time. FIGS. 9-12 illustrate steps of method 200, as explained below.

In a first step (step 201), electrochemical battery packs of a system are controlled to supply power onto an electrical power bus and to receive power from the electrical power bus. In FIG. 3, the memory 128 comprises a set of processor-executable instructions 206 that when executed by the processor 127 causes the battery packs 101-104 to be charged and discharged according to the requirements of the powertrain 115. For example, if battery pack 101 is to receive charge from the DC power bus 124, then processor 127 of PCU 120 transmits a CAN communication 207 to processor 134 of battery controller 116 via local bus 129. Processor 134 in turn controls switching of control signal SW1-SW4 such that the bi-directional buck-boost power converter 130 causes charge to be transferred from DC power bus 124 to battery pack 101. Each of battery packs 102-104 is controlled in a similar fashion depending on how processor 127 of PCU 120 determines charge should be transferred throughout powertrain 115.

Next, whether to determine a characteristic of one of the battery packs is decided (step 202). If a characteristic of one of the battery packs is not to be determined, then all the battery packs continue to operate in a normal fashion (step 201). If, on the other hand, a characteristic of one of the battery packs is to be determined, then a pre-determined impulse current signal is supplied onto the battery pack (step 203). For example, in FIG. 9, the set of processor-executable instructions 206 when executed by the processor 127, determines that a SOH characteristic is to be obtained for battery pack 101.

Figure 9:
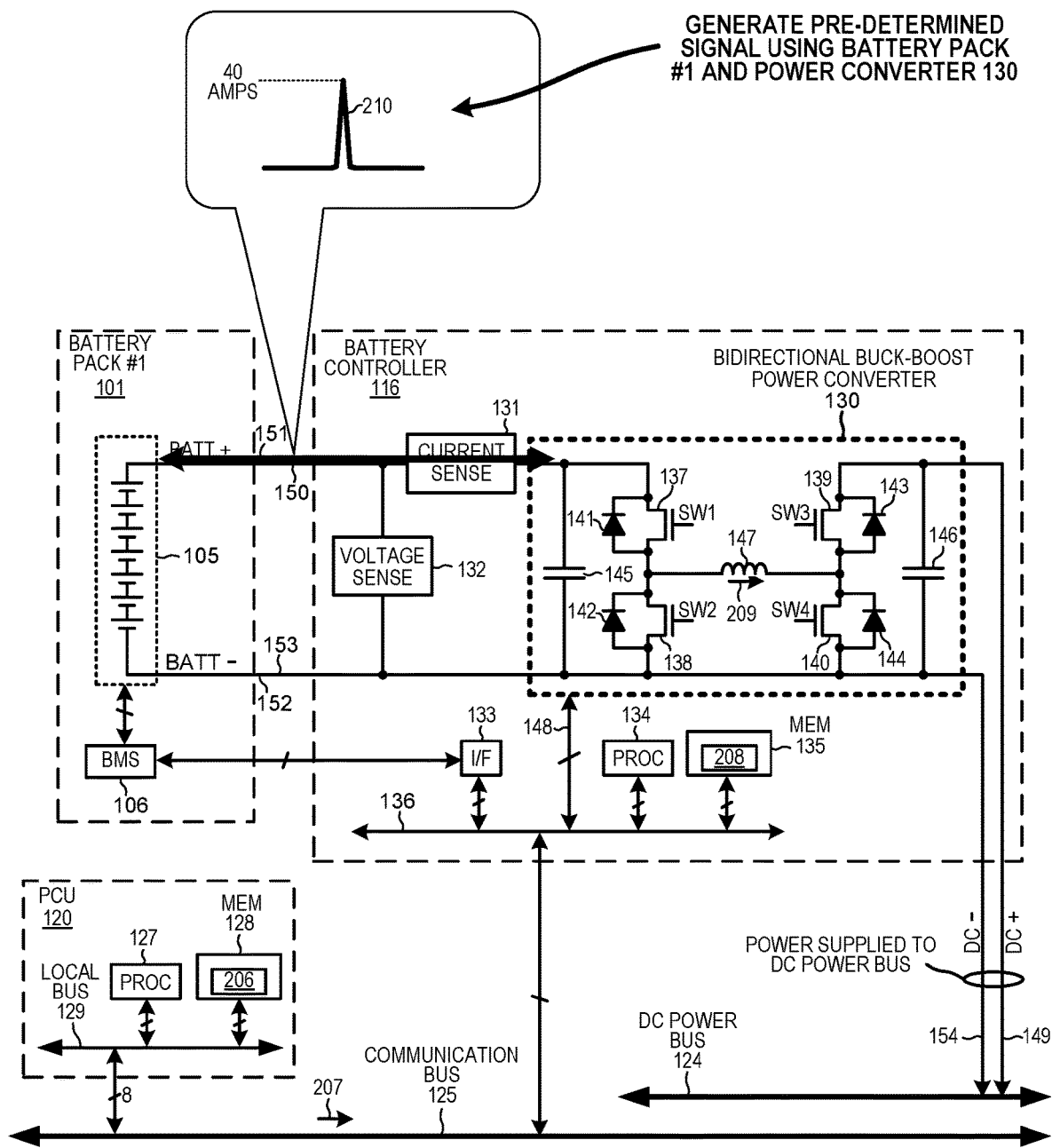
FIG. 9 is a diagram of a pre-determined impulse current signal generated using the battery pack #1 and the switching power converter in accordance with method 200.
Figure 10:
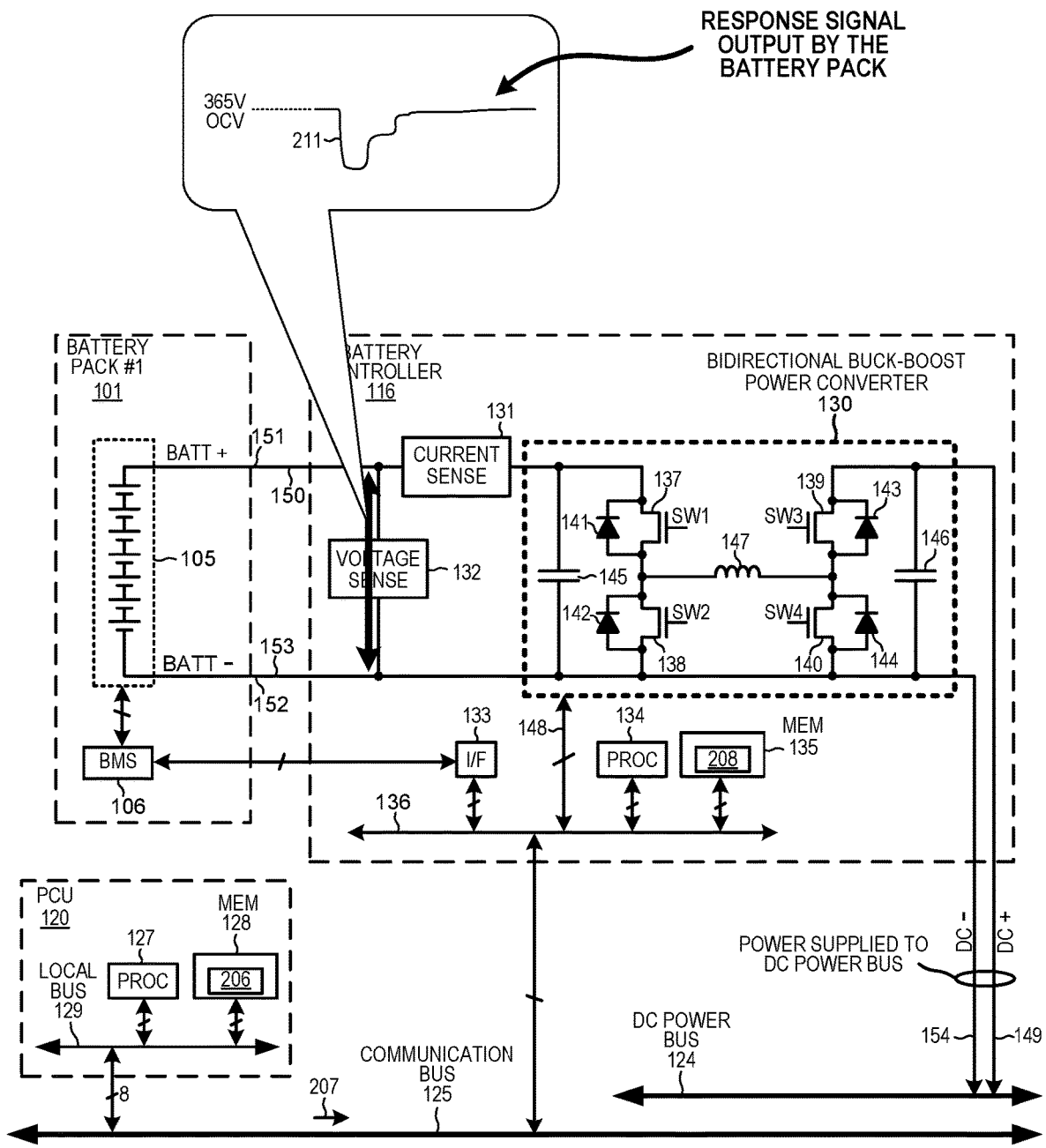
FIG. 10 is a diagram of a response signal output by battery pack #1 that is measured by voltage sense circuitry in accordance with method 200.
Figure 11:
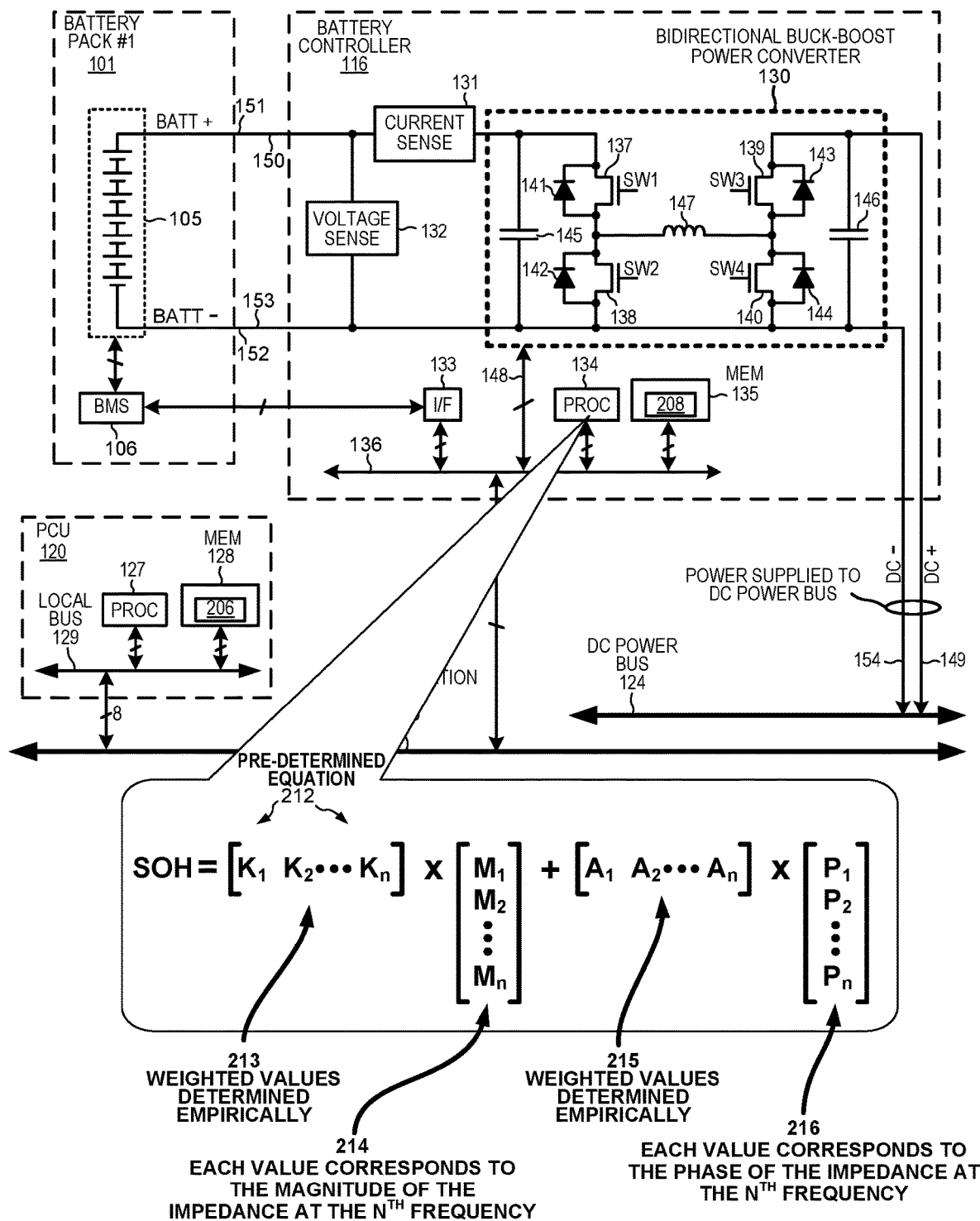
FIG. 11 is a diagram of a pre-determined equation used by the processor to estimate the SOH of battery pack #1 using the obtained estimation of an impedance spectrum in accordance with method 200.

The pre-determined impulse current signal is supplied as follows. In FIG. 9, the memory 135 of battery controller 116 comprises a set of processor-executable instructions 208. When the processor 134 executes the instructions 208, the processor 134 controls digital logic levels of the digital control signals SW1-SW4 such that inductor current 209 ramps up. After the inductor current 209 reaches a current threshold or a certain amount of time elapses, the processor 134 switches the digital logic levels of the control signals SW1-SW4 so that the battery pack 101 supplies an impulse current signal 210 to the bi-directional buck-boost power converter 130 and onto DC power bus 124. The impulse current signal 210 is a forty ampere current pulse. The impulse current signal 210 is said to be "pre-determined" because the information required to generate the current pulse 210 (such as the amplitude of the pulse) is stored in memory 135. In another example, rather than causing impulse current signal 210 to be discharged from the battery pack 101 to the DC power bus 124, the processor 134 controls digital logic levels of the digital control signals SW1-SW4 so that an impulse current signal is supplied from the DC power bus 124 through converter 130 and onto battery pack 101. The impulse current signal is but one type of pre-determined signal that can be generated and other types of pre-determined signals may be generated using the battery pack and the switching power supply.

Next, a voltage between terminals 151 and 152 of the battery is measured (step 204). The voltage is a response signal output by the battery pack 101. For example, in FIG. 10, voltage sense circuit 132 detects the voltage between terminals 151 and 152. The terminal 151 is coupled to BATT+ terminal of cells 105, and the terminal 152 is coupled to BATT− terminal of cells 105. Reference numeral 211 identifies a voltage signal detected by the voltage sense circuit 132. Voltage signal 211 is a time-domain impulse response of the battery pack 101 resulting from impulse current signal 210 input to the battery pack 101. The voltage level and time information of voltage signal 211 is stored in memory 135 of battery controller 116. In another embodiment, the voltage signal information is not detected by voltage sense circuit 132. Instead the voltage information is obtained by BMS 106 and communicated to processor 134 through interface 133 and local bus 136. The voltage sensing of the response signal is performed entirely within the battery pack and no separate voltage sense circuitry external to the battery pack is required to obtain response signal information.

Next, the measured response signal is processed to obtain an estimate of an impedance spectrum for the battery pack (step 205). For example, the processor 134 performs signal processing on the information stored in memory 135 corresponding to the pre-determined impulse current signal 210 and the time-domain voltage signal 211. In one embodiment, the processor 134 performs a Fourier transform operation, such as a Discrete Fast Fourier Transform (DFFT), on the current and voltage information to obtain an estimate of an impedance spectrum. In another embodiment, the processor 134 performs a Spectral Density Estimation on the current and voltage information to obtain an estimate of an impedance spectrum. In yet another embodiment, the processor 134 first performs a DFFT. If the processor 134 determines that the output spectrum is dominated by noise, then the processor 134 then performs a PSD operation. The result of the processing is an estimate of an impedance spectrum of the battery pack 101 that includes resistance (real component of impedance) and reactance (imaginary component of impedance) across various frequencies, such as plot 155 of FIG. 4.

Next, a weighted average is calculated of the resistance and reactance of the battery pack over a plurality of frequencies (step 206). The resistance and reactance information is obtained from the estimate of the impedance spectrum of the battery pack. The result of the weighted average calculation is a value indicative of the SOH of the battery pack. For example, in FIG. 11, the processor 134 uses pre-determined equation 212 stored in memory 135 to process the current and voltage information. The equation 212 includes 1×N weight vector 213, N×1 magnitude vector 214, 1×N weight vector 215 and N×1 phase vector 216. Weight vectors 213 and 215 comprise real number values that are empirically determined. The selected weights vary across types of battery packs, the size of the battery packs, and the chemistry of the electrochemical cells contained within the battery pack, among other factors. Magnitude vector 214 comprises real number values representing the magnitude of the impedance (the resistance) at an $N^{th}$ frequency. Phase vector 216 comprises real number values representing the phase of the impedance (the reactance) at an $N^{th}$ frequency. The result of processor 134 calculating equation 212 is the SOH represented as a percentage.

Figure 12:
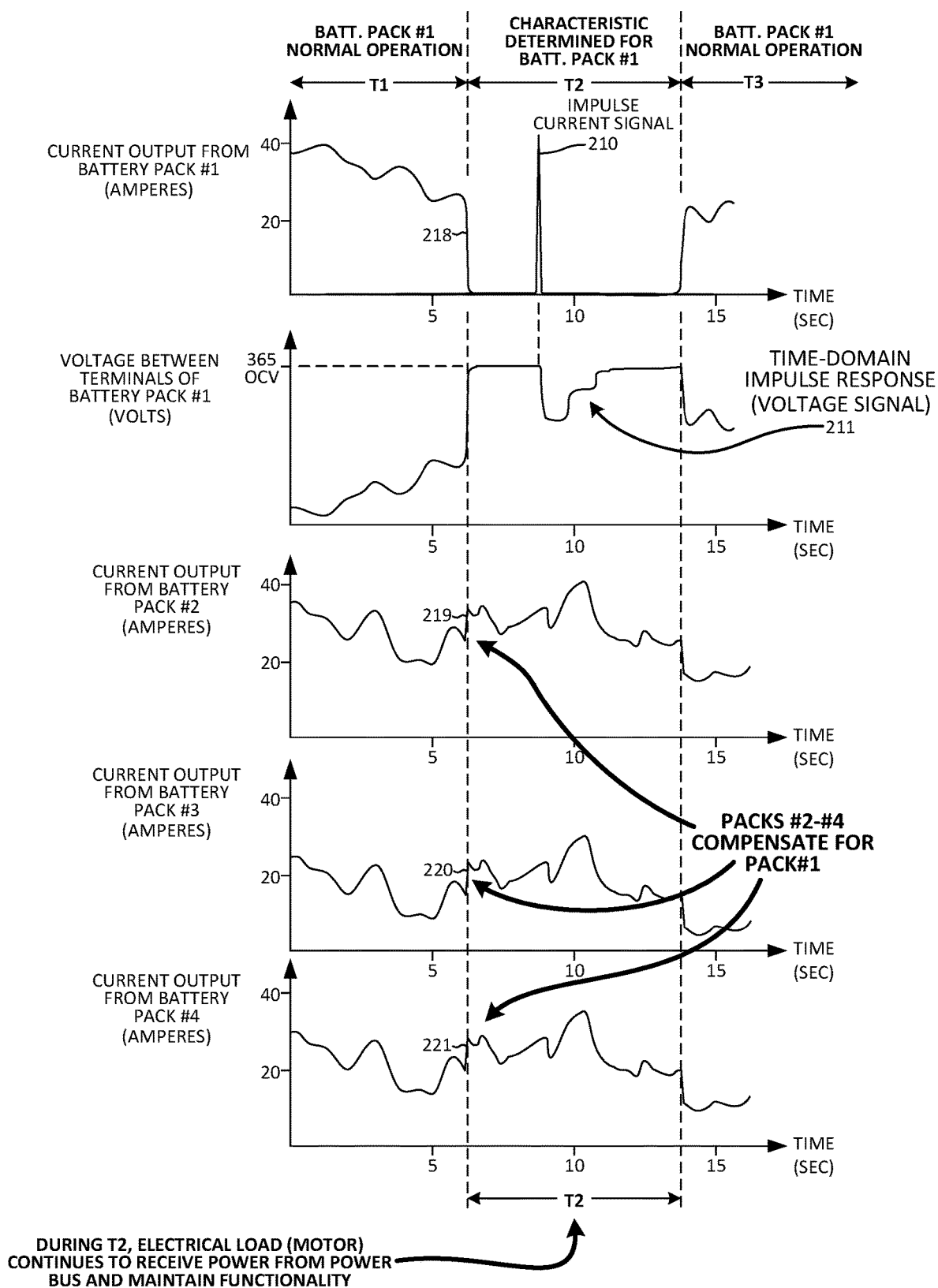
FIG. 12 is a waveform diagram of voltage and current along various nodes of powertrain 115 when processor 134 performs method 200.

FIG. 12 is a waveform diagram of voltage and current along various nodes of powertrain 115 when processor 134 performs method 200. Time period T1 identifies a period of time before processor 134 carries out method 200 to determine the SOH of battery pack #1. Time period T2 identifies the period of time in which the SOH is determined for battery pack #1. At the transition between T1-T2, the processor 127 of PCU 120 determines that the battery pack #1 should output zero current (prior to generating the impulse current signal). Reference numeral 218 identifies the drop in current of battery pack #1. To compensate for this drop in current (from approximately twenty-five amperes to zero amperes), the processor 127 of PCU 120 determines that the other battery packs #2-#4 should together increase by the equivalent amount of current (approximately twenty-five amperes) to compensate for the drop in current. Reference numerals 219-221 identify the steep increase in current output by battery packs #2-#4. As a result of this compensation, any electrical load sourced by the DC power bus 124 will not experience any change in available current. For example, if motor 121 were driving shuttle bus 100, then motor 121 would not experience any change in available supplied current and motor 121 would maintain functionality during the time interval T2. As such, the characteristic of battery pack #1 is determined without perturbing the current supplied to an electrical load such that the current supplied during T2 follows the full-functionality time-varying current draw of the electrical load with the same degree of accuracy this current draw was followed before the T1/T2 transition and does not affect the ability of the load to draw current or perform work. Time period T3 identifies a period of time in which battery pack #1 returns to normal operation after the SOH for battery pack #1 is determined.

Figure 13:
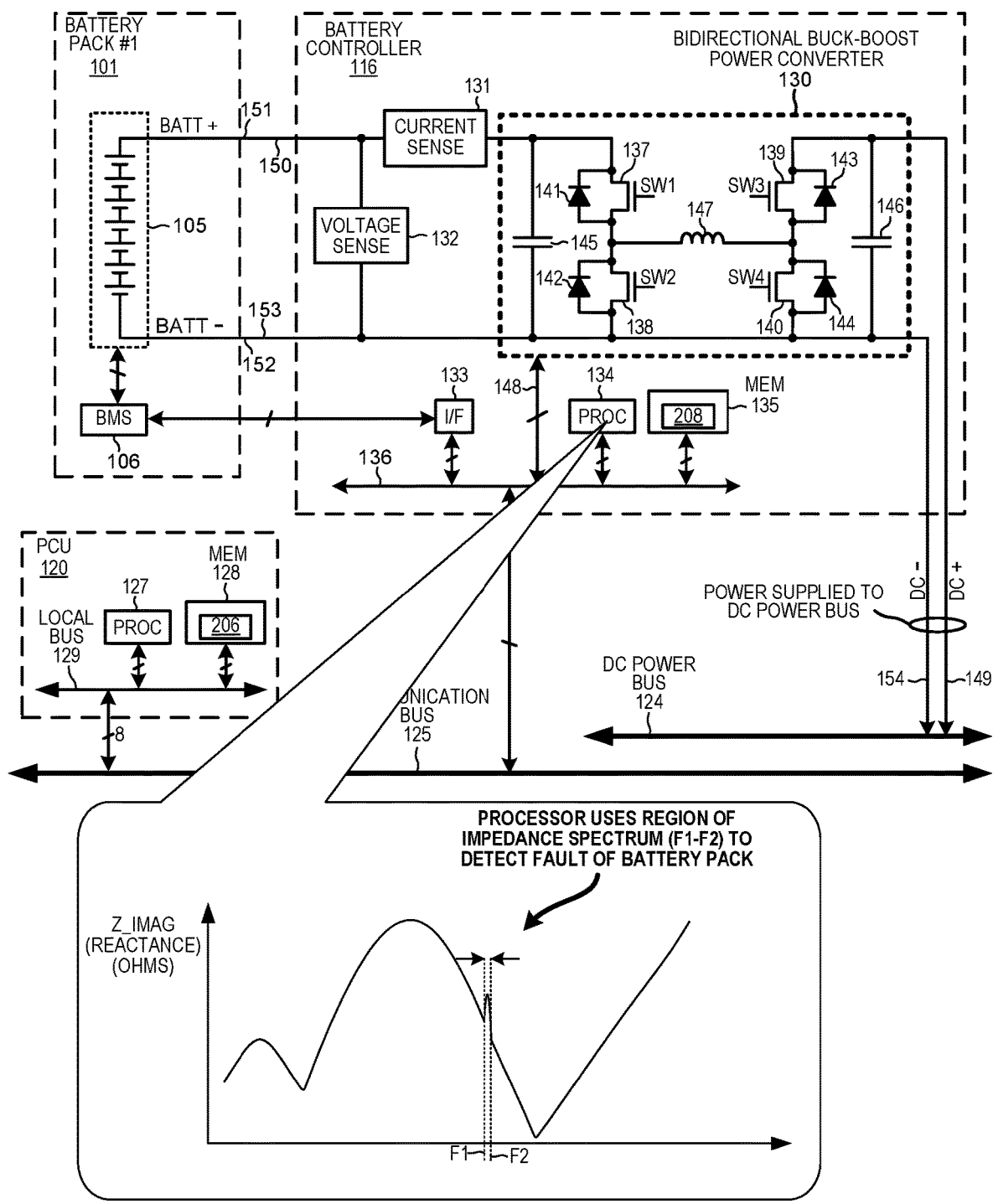
FIG. 13 is a diagram of the processor analyzing the obtained estimation of an impedance spectrum to detect a fault in battery pack #1.

FIG. 13 is a diagram of the processor 134 analyzing the obtained estimate of the impedance spectrum to detect a fault in battery pack #1. After the estimate of the impedance spectrum is obtained in step 205, processor 134 may then analyze the estimate of the impedance spectrum to determine whether a fault is present within battery pack #1. The processor determines that the region of the impedance spectrum estimation between frequencies F1 and F2 has a sharp spike indicating that at least one of the plurality of cells 105 have degraded. As a result of detecting the degraded battery pack cell, processor 134 transmits a communication to processor 127 of PCU 120 indicating the fault. Processor 127 of PCU 120 transmits a communication over a network (not shown) to prompt operator of shuttle bus 100 that the battery pack #1 is degraded. In one example, the communication is a wireless Radio Frequency (RF) communication that is transmitted by a RF transmitter within the PCU 120 and is received on a RF receiver of a notification device located at a shuttle bus station. The notification device presents the degraded battery pack information, including identification information for the particular shuttle bus and battery pack, on a display so that the shuttle bus station knows to replace the battery pack if the degradation exceeds acceptable levels.

Figure 14:
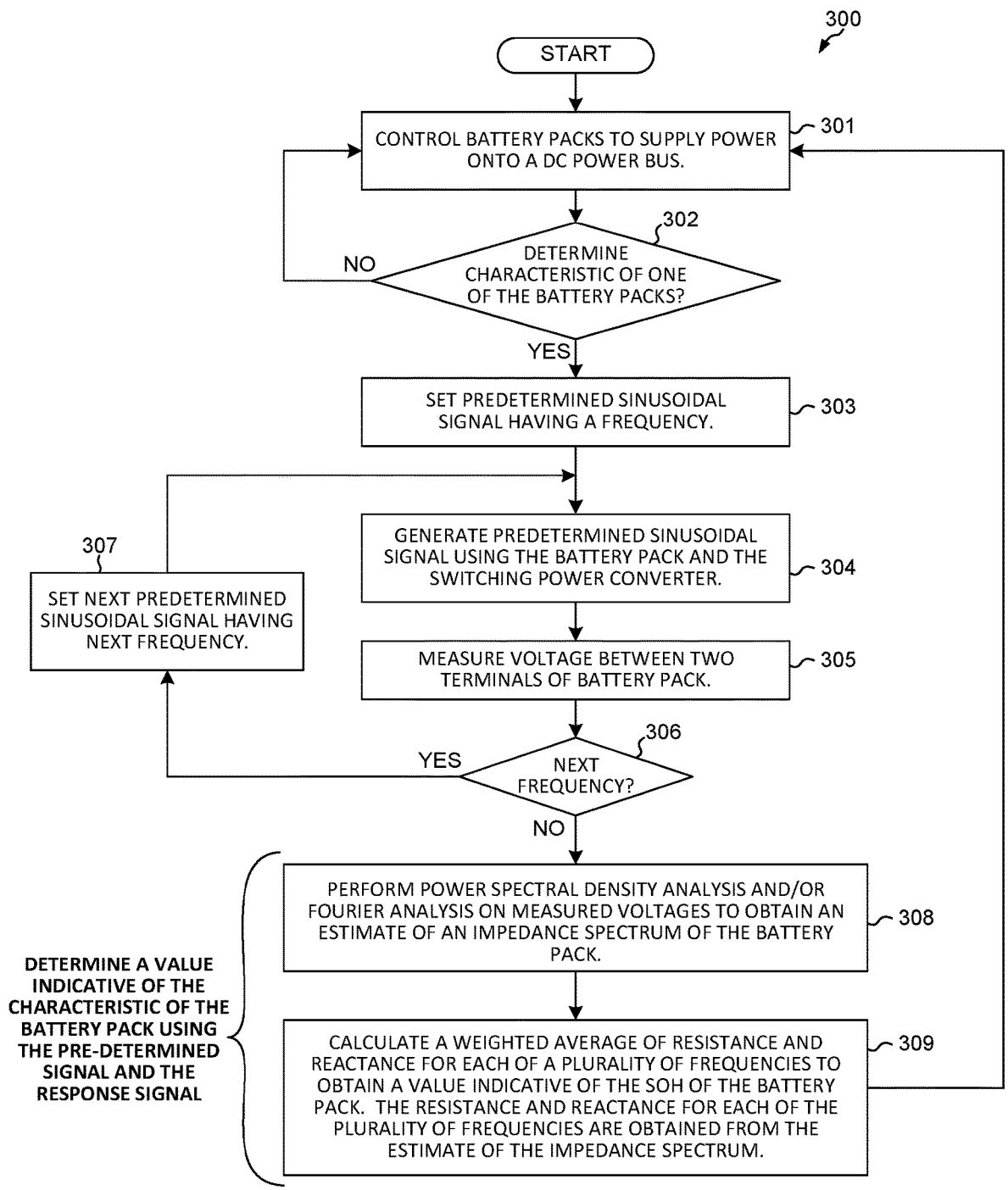
FIG. 14 is a flowchart of a method 300 in accordance with another novel aspect.

FIG. 14 is a flowchart of a method 300 in accordance with another novel aspect. In one embodiment, battery controller 116 is realized as a single integrated circuit that performs method 300 to obtain a characteristic of one of the battery packs 101-104 of the powertrain 115 in FIG. 2. Method 300 involves using a plurality of low frequency (0.1 Hz to 100 Hz) current signals to obtain response signals in the form of voltage signals to then obtain the estimate of the impedance spectrum. Carrying out method 300 yields an SOH estimation of the battery pack.

In a first step (step 301), electrochemical battery packs of a system are controlled to supply power onto an electrical power bus and to receive power from the electrical power bus. For example, the PCU 120 of FIG. 2 controls the charge and discharge of battery packs #1-4 according to the power requirements of powertrain 115.

Next, whether to determine a characteristic of one of the battery packs is decided (step 302). If a characteristic of one of the battery packs is not to be determined, then all the battery packs continue to operate in a normal fashion (step 301). If, on the other hand, a characteristic of one of the battery packs is to be determined, then a pre-determined sinusoidal signal having an initial frequency is set (step 303). For example, in FIG. 15, a sinusoidal current signal 310 having a frequency of 0.1 Hz is set by processor 134 reading amplitude and frequency information from memory 135 via local bus 136.

Next, the predetermined sinusoidal signal is generated using the battery pack and the switching power converter (step 304). For example, in FIG. 15 the sinusoidal current signal 310 having a frequency of 0.1 Hz is generated using the battery pack 101 and the bi-directional buck-boost converter 130. The sinusoidal current signal 310 ranges in amplitude from −20 amperes to +20 amperes and is generated by the bi-directional buck-boost power converter 130 in a technique similar to that described with regard to FIG. 8.

Next, a voltage between two terminals of the battery pack is measured resulting in a voltage signal (step 305). The voltage signal is an output response of the battery pack #1. The voltage signal information and the input current sinusoidal current signal 310 is stored in memory 135.

Figure 15:
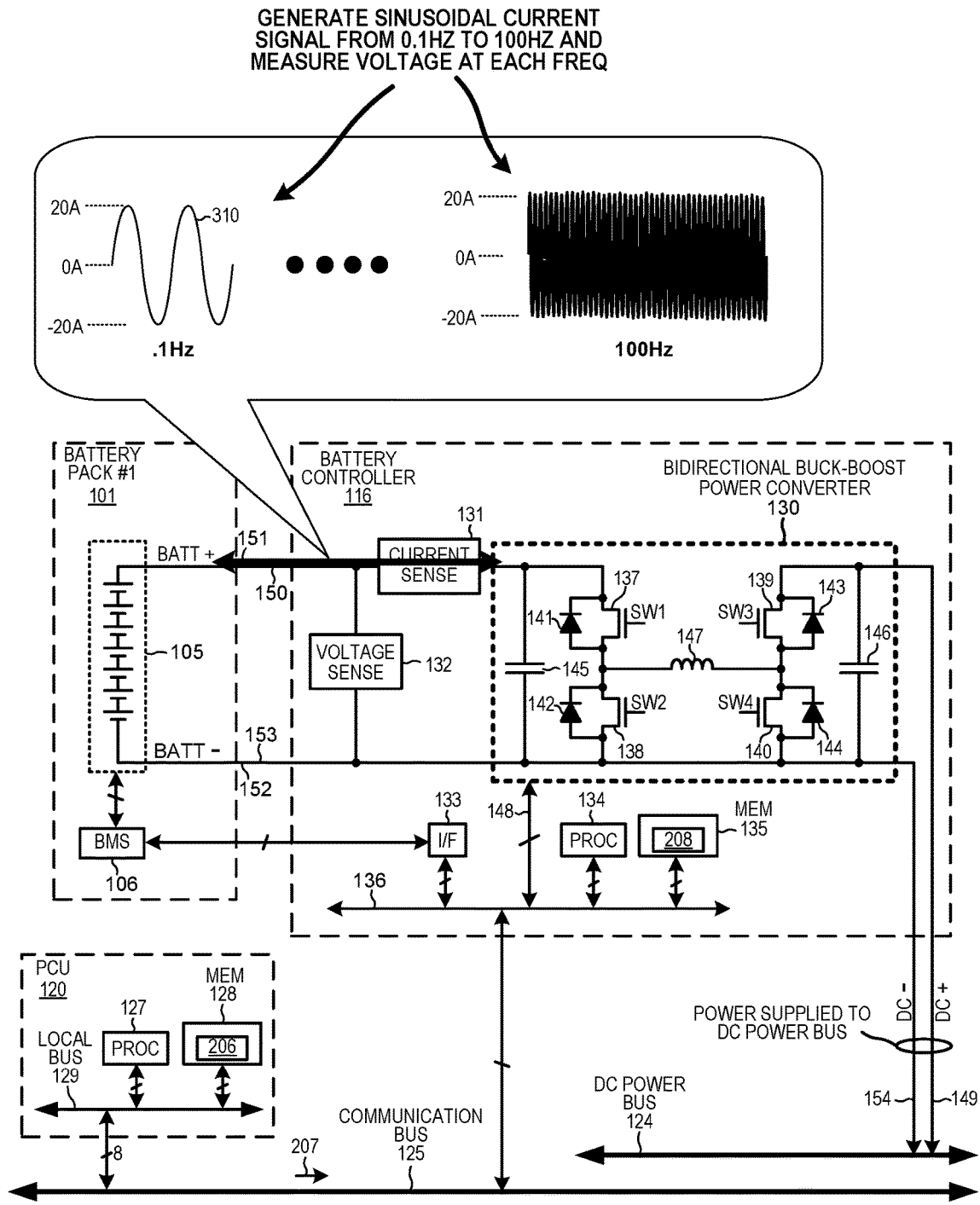
FIG. 15 is a diagram of a pre-determined sinusoidal current signal using the battery pack #1 and the switching power converter in accordance with method 300.

Next, a decision is made whether another sinusoidal current signal having a next frequency is to be used to obtain another voltage response signal (step 306). If it is determined that another sinusoidal current signal is to be generated having a next frequency, then the processor 134 reads amplitude and frequency information of the next signal from memory 135 via local bus 136, and steps 304 and 305 are repeated. In the example of FIG. 15, a plurality of sinusoidal current signal having a frequency between 0.1 Hz and 100 Hz are used. Typically, less than five different sinusoidal current signals are used to minimize the time required to estimate the SOH of the battery pack.

After the voltage signal information is collected for the plurality of sinusoidal current signals, signal processing is performed to obtain an estimate of an impedance spectrum of the battery pack (step 308). Next, the estimate of the impedance spectrum information is used to obtain a value indicative of the SOH (step 309). This is similar to the technique described with regard to FIG. 11, except equation 212 would include additional vector operations to incorporate the additional voltage signal information in the SOH estimation.

Figure 16:
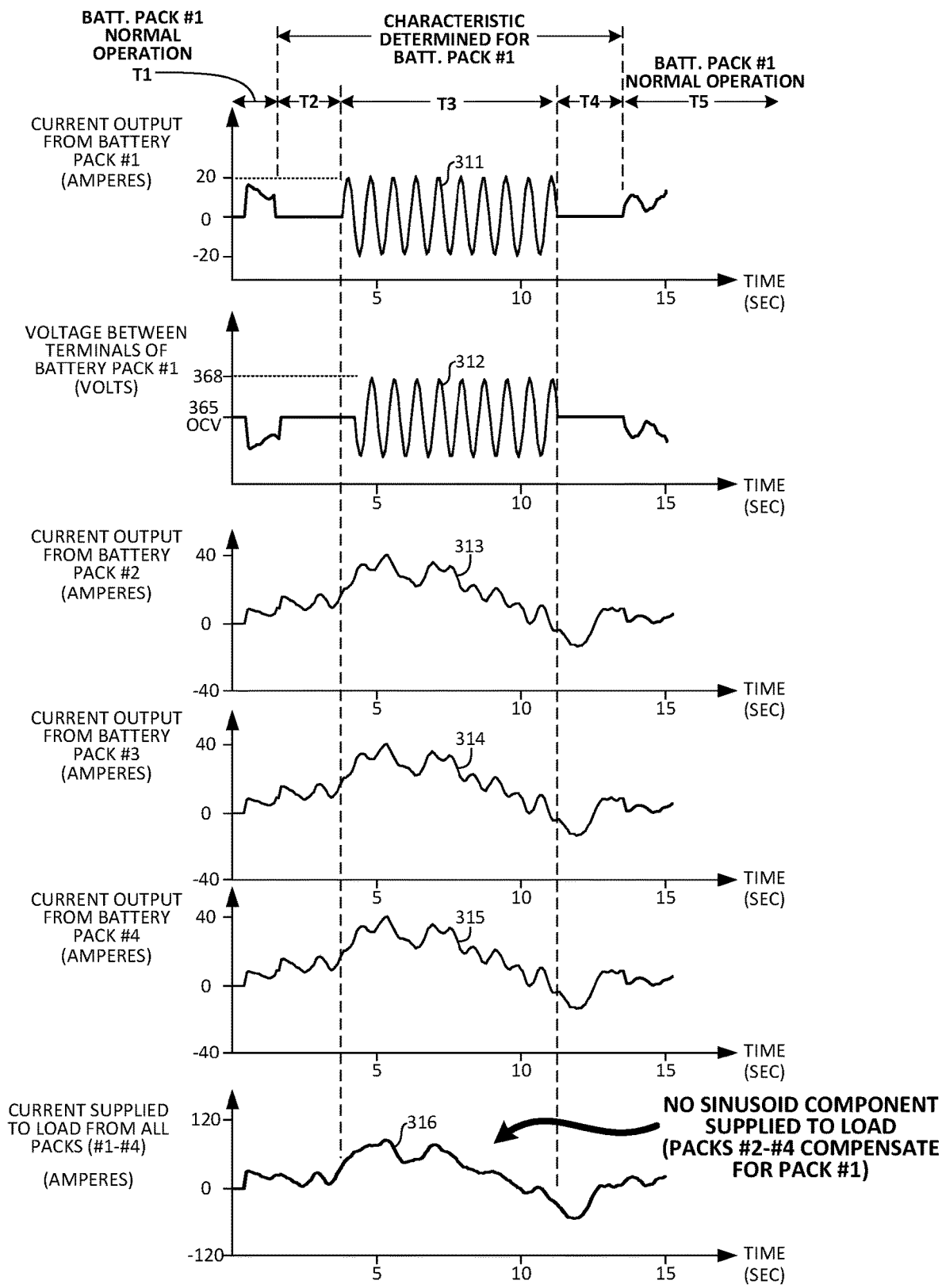
FIG. 16 is a waveform diagram of voltage and current along various nodes of powertrain 115 when processor 134 performs method 300.

FIG. 16 is a waveform diagram of voltage and current along various nodes of powertrain 115 when processor 134 performs method 300 using a pre-determined sinusoidal signal 311 having a frequency of 1 Hz and an amplitude from −20 amperes to +20 amperes. Time period T1 identifies a period of time before processor 134 carries out method 300 to determine the SOH of battery pack #1. Time period T2-T4 identifies the period of time in which the SOH is determined for battery pack #1. At the transition between T1-T2, the processor 127 of PCU 120 determines that the battery pack #1 should output zero current for a period of time T2 (prior to generating the sinusoidal current signal). The processor 127 of PCU 120 determines that the other battery packs #2-4 should increase by the equivalent amount of current to compensate for the drop in current.

At the T2/T3 transition, battery pack #1 is controlled to output a pre-determined sinusoidal current signal 311. During the T3 time period, the battery pack #1 and the bi-directional buck-boost converter 130 generate the sinusoidal current signal 311. Reference numeral 312 identifies a measured voltage signal which is output by the battery pack in response to generating the sinusoidal current signal 311. The voltage signal 312 is a time-delayed version of the sinusoidal current signal 311. To compensate for the sinusoidal current output by battery pack #1, the processor 127 of PCU 120 determines that the other battery packs #2-4 should output a sinusoidal current to cancel the effect of the sinusoidal current being output by battery pack #1. Reference numerals 313-315 identify the current output by the other battery packs #2-4 each of which is one-hundred and eighty degrees out of phase with the sinusoidal current signal 311 and the sum of the amplitude of each cancels the effect of signal 311. As a result, the current supplied from the battery packs #1-#4 to the DC power bus 124 is unaffected during the SOH determination period (T2-T4). Reference numeral 316 identifies a current signal supplied to an electrical load drawing current from DC power bus 124. As shown, current 316 does not include any sinusoid components during T3. As such, the characteristic of battery pack #1 is determined without perturbing the current supplied to an electrical load such that the current supplied during T2 follows the full-functionality current draw from the electrical load with the same accuracy it did before the T2/T3 transition and does not impact the functionality of the electrical load or the current draw of the electrical load.

During the T4 time period, the battery pack is controlled to output zero current. During the T5 time period, battery pack #1 resumes normal operation, and battery packs #2 through #4 no longer compensate for battery pack #1, rather all four battery packs share the load. The zero-current output during time periods T2 and T4 is not required. For example, the battery pack #1 may immediately transition from normal operation to being supplied with a current signal for SOH determination, and then transition back to normal operation without any zero-current operation.

Figure 17:
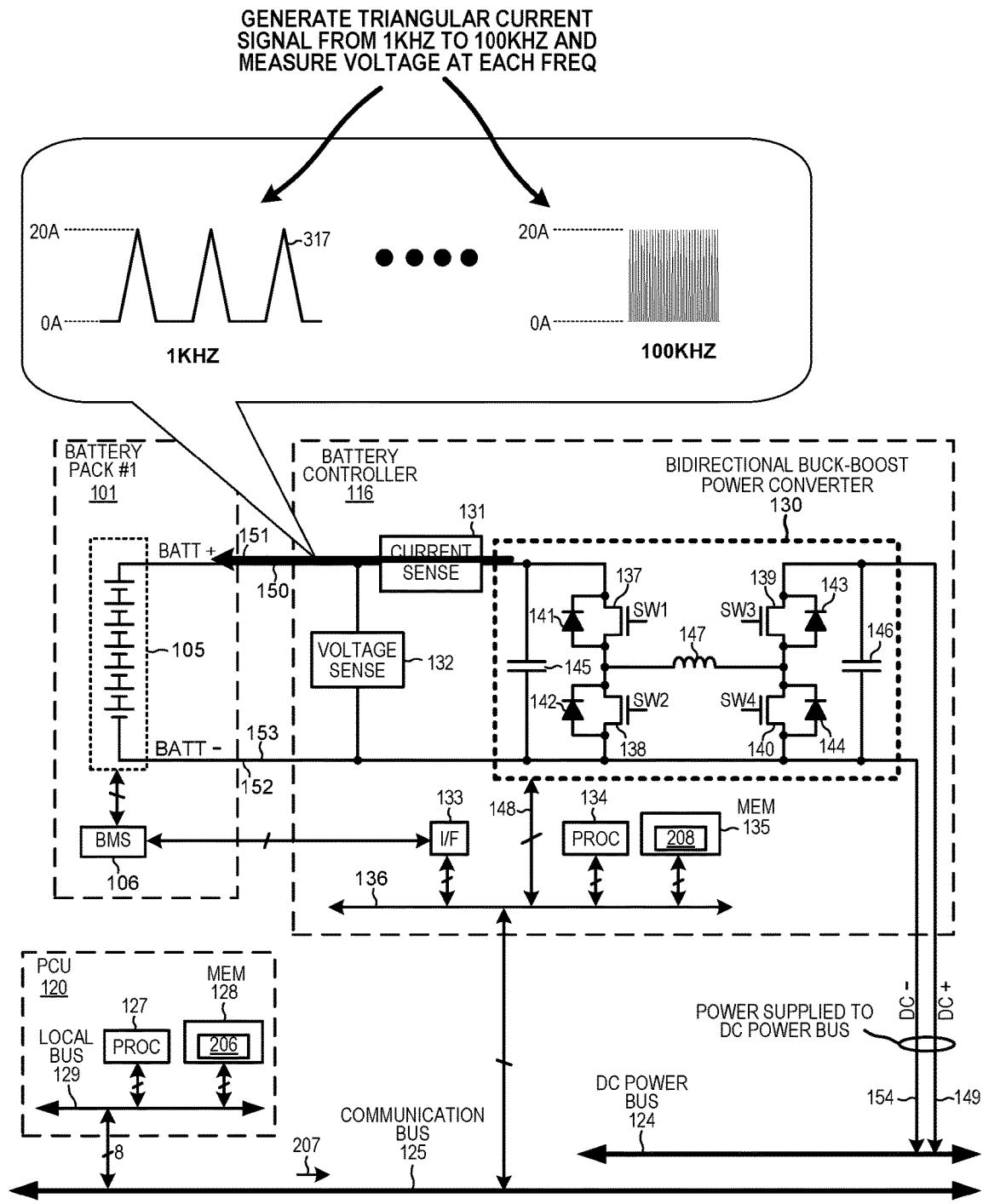
FIG. 17 is a diagram showing the use of high-frequency (1 kHz to 100 kHz) current signals to carry out method 300.

FIG. 17 is a diagram showing the use of high-frequency (1 kHz to 100 kHz) current signals to carry out method 300. Reference numeral 317 identifies a triangular current signal having a frequency of 1 kHz and an amplitude ranging from +0 amperes to +20 amperes. The triangular current signal 317 is generated in a similar fashion as sinusoidal current signal 310 of FIG. 15.

Figure 18:
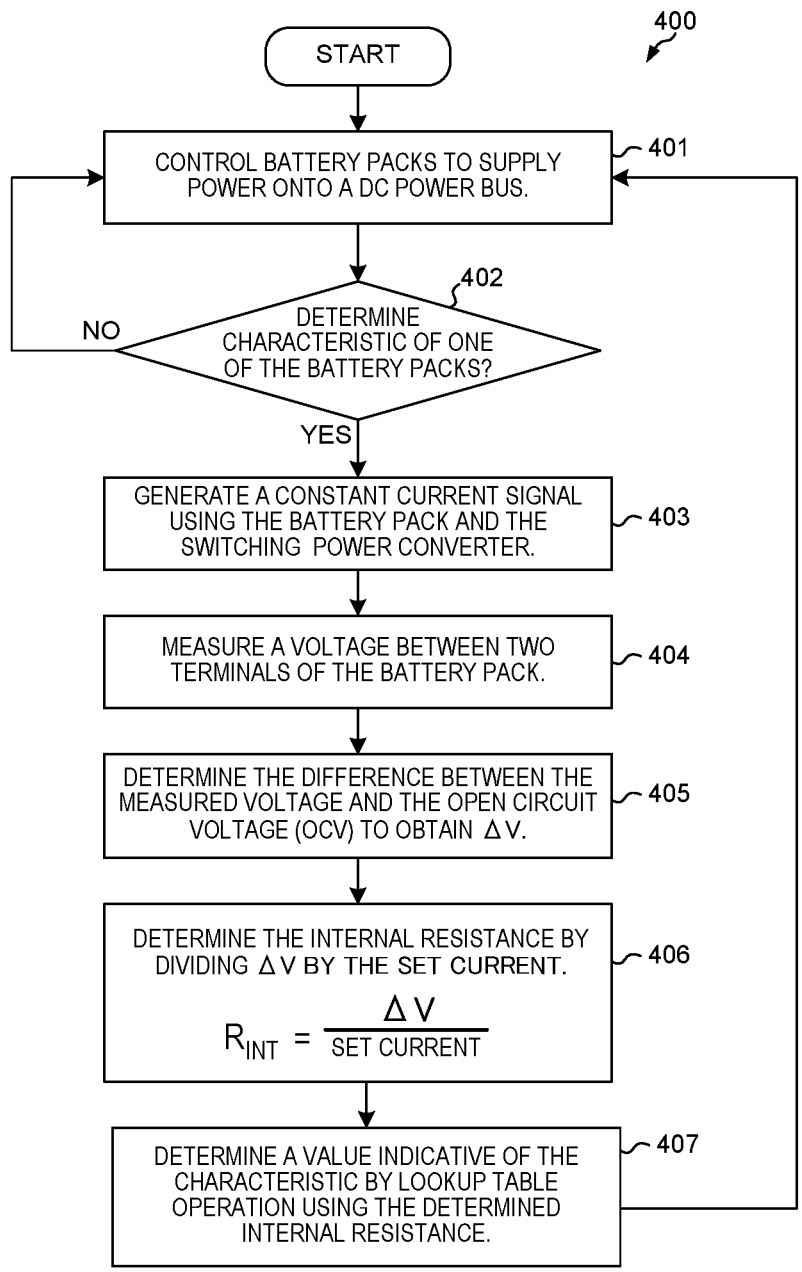
FIG. 18 is a flowchart of a method 400 in accordance with yet another novel aspect.

FIG. 18 is a flowchart of a method 400 in accordance with yet another novel aspect. Method 400 provides a method of determining the internal resistance of a battery pack to determine a battery pack characteristic. Carrying out method 400 yields an SOH estimation or an SOC estimation of the battery pack.

In a first step (step 401), electrochemical battery packs of a system are controlled to supply power onto an electrical power bus and to receive power from the electrical power bus. For example, the PCU 120 of FIG. 2 controls the charge and discharge of battery packs #1-4 according to the power requirements of powertrain 115.

Next, whether to determine a characteristic of one of the battery packs is decided (step 402). If a characteristic of one of the battery packs is not to be determined, then all the battery packs continue to operate in a normal fashion (step 401). If, on the other hand, a characteristic of one of the battery packs is to be determined, then a pre-determined constant current signal is generated using the battery pack and the switching power converter (step 403). The constant current signal is generated by the bi-directional buck-boost converter 130. A value at which the current signal is held constant is stored in memory 135.

Next, a voltage between two terminals of the battery pack is measured (step 404). For example, voltage sense circuit 132 measures the voltage signal generated by the battery pack #1 in response to receiving the constant current signal. The measured voltages that form the voltage signal are stored in memory 135.

Next, a difference between the measured voltage and the Open Circuit Voltage (OCV) is calculated to obtain the change in voltage (step 405). The processor 134 reads the measured voltages that form the voltage signal from memory 135 over local bus 136. Next, the internal resistance is calculated by dividing the change in voltage by the set current (step 406). The processor 134 reads one of the measured voltages and the current from memory 135 and computes the difference.

Figure 19:
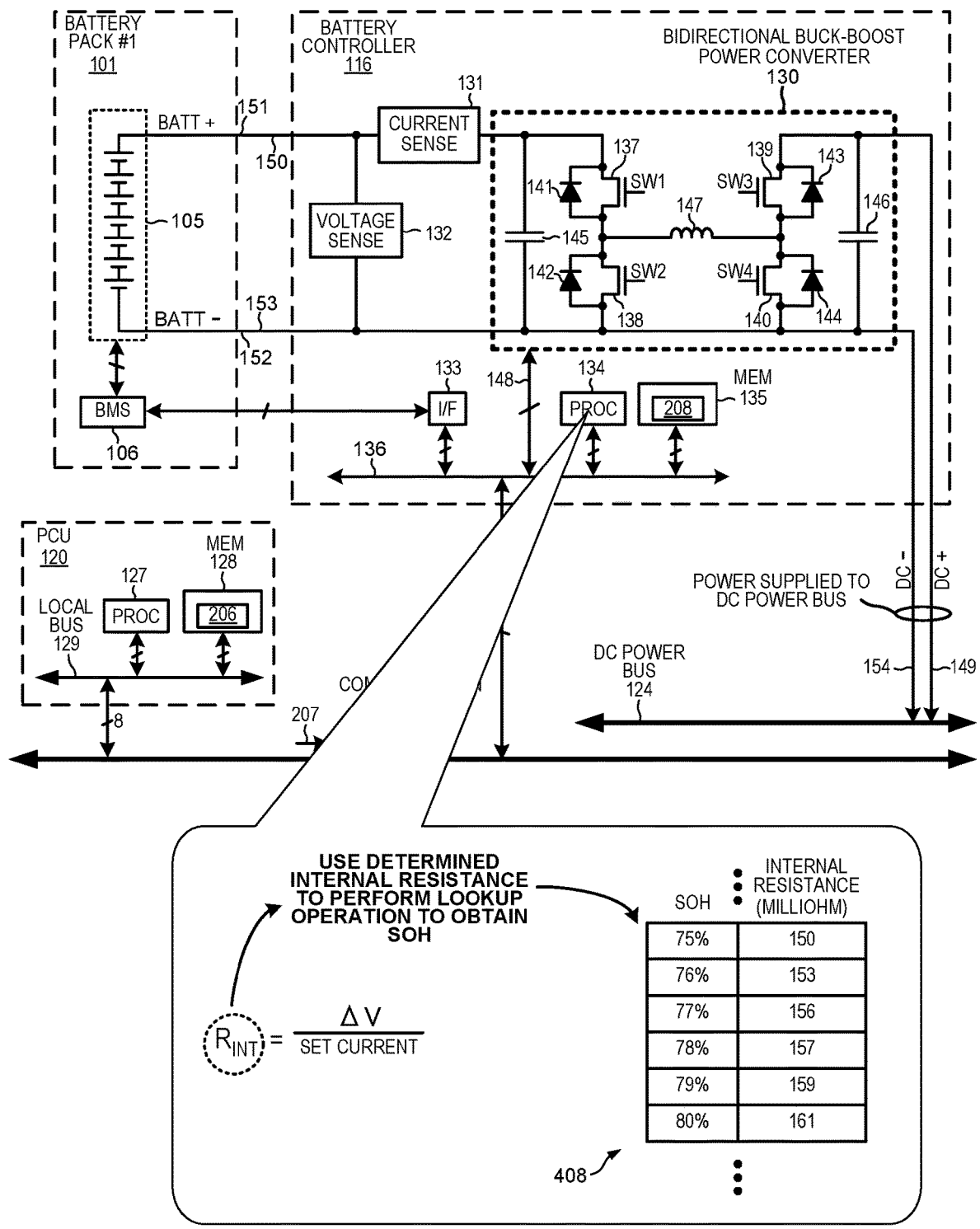
FIG. 19 is a diagram showing how the SOH of battery pack #1 is estimated by determining the internal resistance.
Figure 20:
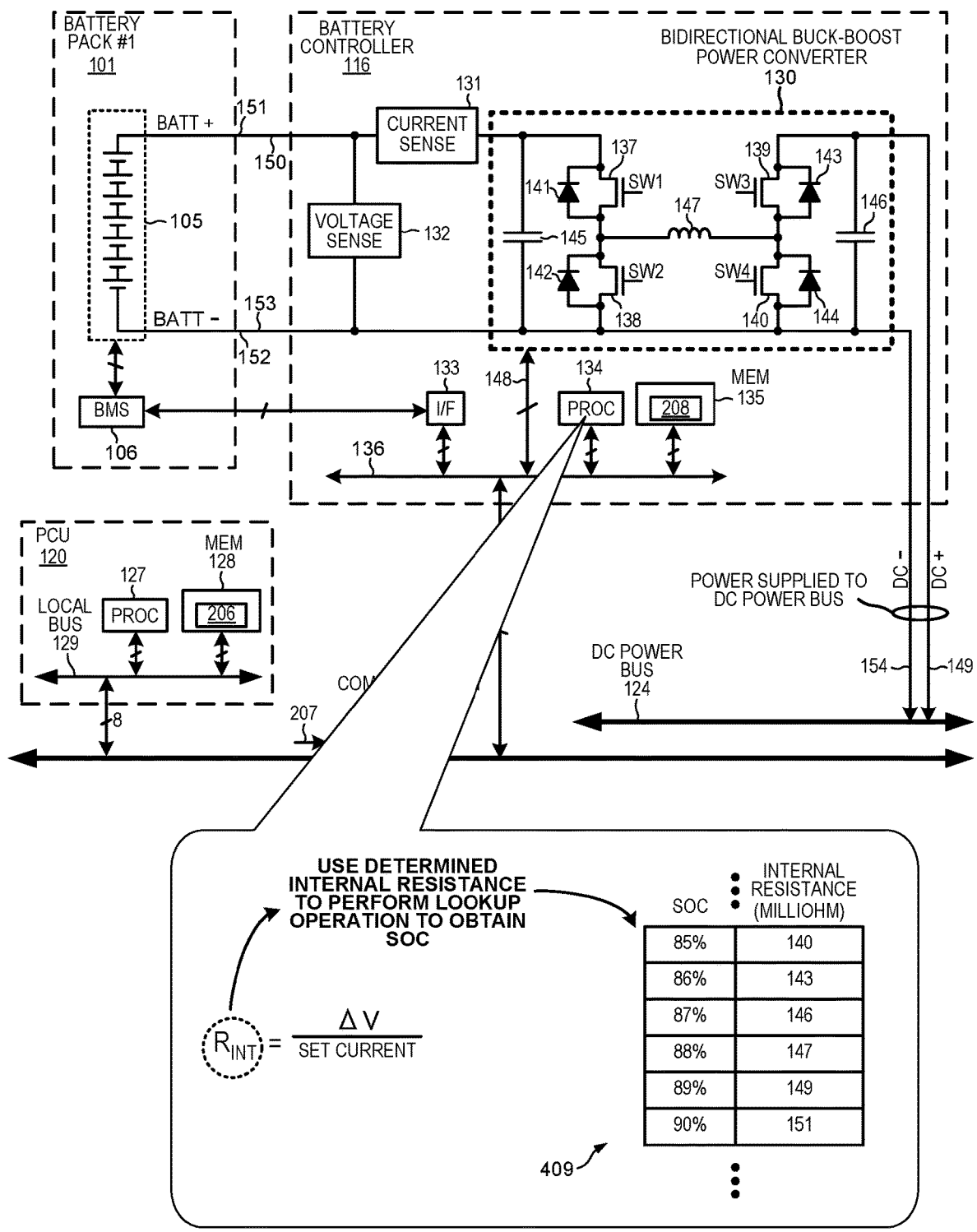
FIG. 20 is a diagram showing how the SOC of battery pack #1 is estimated by determining the internal resistance.

Next, a value indicative of the characteristic is determined by a look-up table operation using the determined internal resistance (step 407). The characteristic determined using the internal resistance is SOH (as shown in FIG. 19) or SOC (as shown in FIG. 20) of the battery pack. In the example of FIG. 19, a look-up table 408 that associates an internal resistance with a percentage indicative of SOH is stored in memory 135. The processor 134 performs a look-up operation using the determined internal resistance to obtain the SOH estimation of the battery pack. In the example of FIG. 20, a look-up table 409 that associates an internal resistance with a percentage indicative of SOC of the battery pack is stored in memory 135. The processor 134 performs a look-up operation using the determined internal resistance to obtain the SOC estimation of the battery pack.

Figure 21:
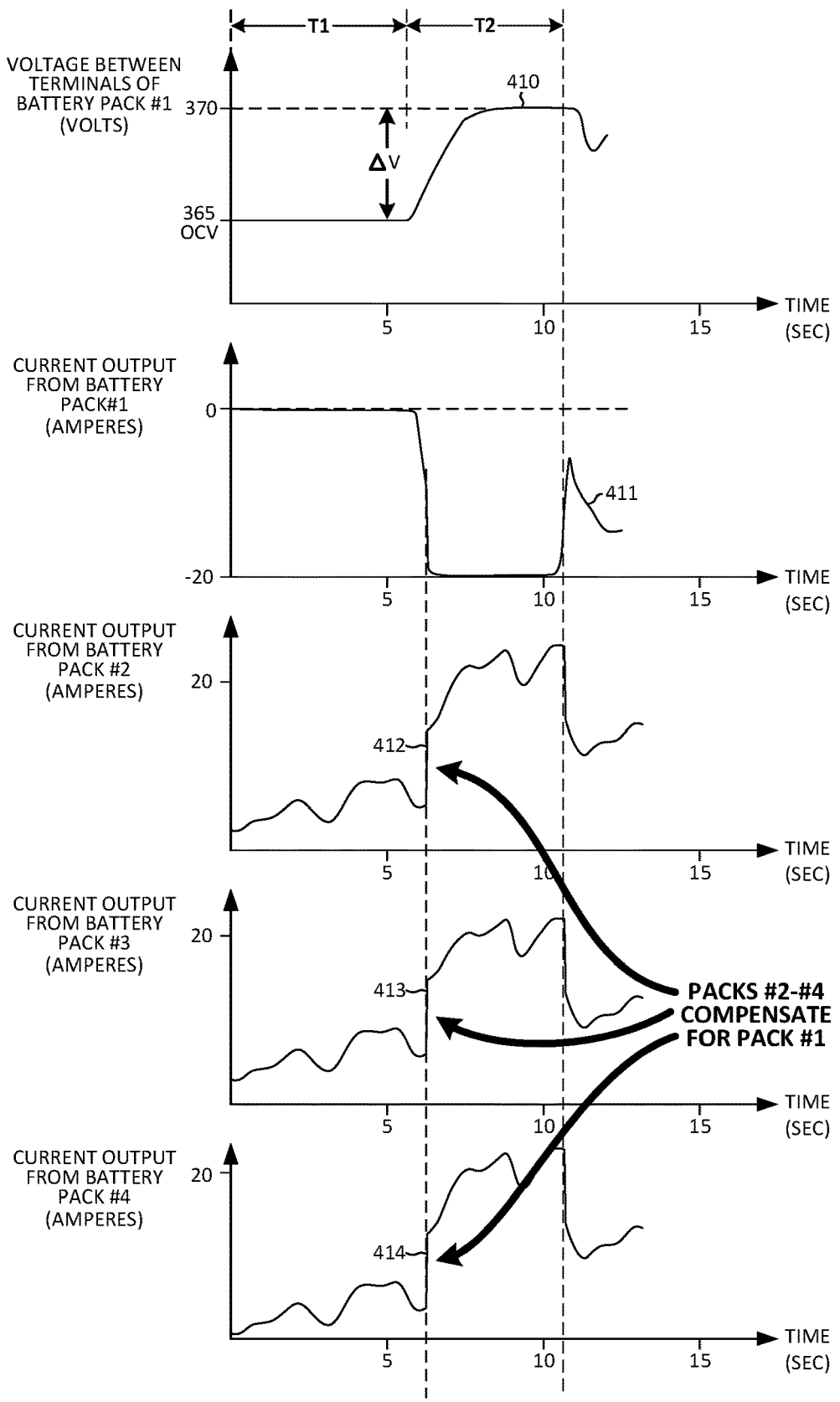
FIG. 21 is a waveform diagram of voltage and current along various nodes of powertrain 115 when processor 134 carries out method 400.

FIG. 21 is a waveform diagram of voltage and current along various nodes of powertrain 115 when processor 134 carries out method 400. Reference numeral 410 identifies the voltage signal output by battery pack #1, and reference numeral 411 identifies the current output by battery pack #1 (or the current signal supplied to battery pack #1). During a time period T1, battery pack #1 is made to operate at zero-current level. The voltage signal 410 is at the OCV level of 365V. Then, during a time period T2, battery pack #1 is controlled to output a constant current of −20 amperes. At the T1-T2 transition, battery packs #2-#4 compensate for the sudden increase in current supplied to battery pack #1. Reference numerals 412-414 identify the steep increase in current output by battery packs #2-#4 to compensate for battery pack #1. Accordingly, the characteristic of battery pack #1 is determined without perturbing the current supplied to an electrical load such that the current supplied during T1 continues to match the current draw of the electrical load and does not impact the functionality of the electrical load or the ability of the electrical load to draw current.

Although certain specific embodiments are described above for instructional purposes, the teachings of this patent document have general applicability and are not limited to the specific embodiments described above. For example, in another embodiment, the ESS is an electrochemical battery pack, and the plurality of electrochemical battery packs is part of an electrical power grid that includes a three-phase Alternating Current (AC) power bus. Each of the plurality of electrochemical battery packs are coupled to the three-phase Alternating Current (AC) power bus through a bi-directional AC/DC converter. A controller operates similar to the methods described above to determine the SOH characteristic and the SOC characteristic of any one of the battery packs. During estimation of a SOH or SOC characteristic of the battery pack, if a pre-determined signal is to be supplied to the battery pack, then the bi-directional AC/DC converter operates in a rectifier mode drawing current from the three-phase AC power bus. If, on the other hand, the pre-determined signal is to be supplied from the battery pack to the bi-directional AC/DC converter and onto the three-phase AC power bus, then the bi-directional AC/DC converter operates in an inverter mode. During the estimation of either the SOH or SOC characteristic, the estimation is performed without disrupting any electrical load that sources or sinks current from the three-phase AC power bus of the power grid. Accordingly, various modifications, adaptations, and combinations of various features of the described embodiments can be practiced without departing from the scope of the invention as set forth in the claims.

What is claimed is:

1. A method comprising:
(a) controlling a plurality of Energy Storage Systems (ESSs) to supply power onto an electrical power bus and to receive power from the electrical power bus, wherein each of the ESSs is coupled to one of a plurality of switching power converters, and wherein each of the switching power converters is coupled to the electrical power bus and is also coupled to a communication bus;
(b) generating a pre-determined signal using a first switching power converter, wherein charge flows from a first ESS onto the electrical power bus via the first switching power converter, wherein charge flows from the electrical power bus onto a second ESS via a second switching power converter, and wherein current is sourced or sinked between the first and second ESSs;

(c) measuring a response signal output by the first ESS as a result of generating the pre-determined signal in (b); and (d) determining a value indicative of a characteristic of the first ESS using the pre-determined signal and the response signal.

2. The method of claim 1, wherein the characteristic of (d) is State Of Health (SOH), and wherein the SOH is a percentage that indicates an amount of recharge cycles remaining in the first ESS until the first ESS is inoperable.

3. The method of claim 1, wherein the characteristic of (d) is State Of Charge (SOC), and wherein SOC is a percentage that indicates an amount of charge remaining in the first ESS.

4. The method of claim 1, wherein the characteristic of (d) is State Of Health (SOH), wherein the pre-determined signal of (b) is a predetermined current signal and the response signal measured in (c) is a voltage signal, and wherein the determining of the value indicative of the SOH of (d) comprises:
(d1) processing the response signal to obtain an estimate of an impedance spectrum of the first ESS; and
(d2) calculating the value indicative of the SOH of the first ESS using values of the estimate of the impedance spectrum obtained in (d1) and a pre-determined equation.

5. The method of claim 1, wherein the pre-determined signal of (b) is a pre-determined current signal and the response signal measured in (c) is a voltage signal, and wherein the determining of the value of (d) comprises:
(d1) determining a difference between a voltage value of the voltage signal measured in (c) and an Open Circuit Voltage (OCV) of the first ESS, wherein the OCV is a pre-determined value;
(d2) determining an internal resistance of the first ESS by dividing the difference determined in (d1) by a current value of the pre-determined current signal of (b); and
(d3) performing a lookup operation on a lookup table using the internal resistance determined in (d2) to obtain the value indicative of the characteristic, and wherein the characteristic is taken from the group consisting of: State Of Health (SOH) and State Of Charge (SOC).

6. The method of claim 1, wherein the load is supplied power from the electrical power bus as a result of the controlling of (a), wherein (b) through (d) are performed during a time interval, and wherein the electrical load continues to receive power from the power bus and maintain functionality during the time interval.

7. The method of claim 6, wherein at least one of the plurality of ESSs is charged during the time interval, and wherein any substantial change in the power supplied to the load during the time interval is due to a change in power demands of the load and not due to the generating of the pre-determined signal.

8. The method of claim 1, wherein each ESS is an electrochemical battery pack that stores at least five kilowatt hours, wherein the electrochemical battery packs are part of a powertrain of an electric vehicle, and wherein (b) and (d) are performed by one and only one integrated circuit.

9. The method of claim 1, wherein the each ESS is an electrochemical battery pack that stores at least five kilowatt hours, wherein the electrochemical battery packs are part of an electrical power grid, and wherein (b) and (d) are performed by one and only one integrated circuit.

10. The method of claim 1, wherein the electrical power bus is a Direct Current (DC) power bus, and wherein each of the switching power converters of (b) is a bi-directional buck-boost power converter that is coupled between one of the ESSs and the DC power bus.

11. The method of claim 1, wherein the pre-determined signal is selected from the group consisting of: a pre-determined constant current signal, a pre-determined impulse current signal, a pre-determined sinusoidal current signal, a pre-determined step current signal, and a pre-determined triangular current signal, and wherein the response signal measured in (c) is a voltage signal.

12. A system comprising:
an electrical power bus that supplies a load;
a communication bus;
a plurality of Energy Storage Systems (ESSs), wherein each of the ESSs is configured to supply energy onto the electrical power bus and to receive energy from the electrical power bus; and
a plurality of controllers, wherein each of the controllers is coupled to one of the ESSs and is also coupled to the electrical power bus and to the communication bus, wherein each of the controllers comprises:
a switching power converter, wherein a pre-determined signal is generated using the switching power converter by transferring energy from one of the ESSs to the electrical power bus via the switching power converter, wherein energy is transferred from the electrical power bus to another of the ESSs, and wherein current is sourced or sinked between at least two of the ESSs;
a sense circuit that measures a response signal output by the one of the ESSs as a result of the pre-determined signal that is generated; and
a processor that determines a value indicative of a characteristic of the one of the ESSs using the pre-determined signal and the response signal.

13. The system of claim 12, wherein the characteristic is State Of Health (SOH), and wherein the processor determines the value indicative of the SOH by: processing the response signal to obtain an estimate of an impedance spectrum, and calculating the value indicative of the SOH by using values of the estimate of the impedance spectrum and a pre-determined equation.

14. The system of claim 12, wherein the response signal is a voltage signal, wherein the pre-determined signal is a current signal, wherein the processor determines the value indicative of the characteristic by: determining a difference between a voltage value of the voltage signal and an Open Circuit Voltage (OCV) of the one of the ESSs, determining an internal resistance of the one of the ESSs by dividing the difference by a current value of the current signal, and performing a lookup operation on a lookup table using the internal resistance to obtain the value indicative of the characteristic, and wherein the characteristic is taken from the group consisting of: State Of Health (SOH) and State Of Charge (SOC).

15. The system of claim 12, wherein the generating of the pre-determined signal, the measuring of the response signal, and the determining of the value indicative of the characteristic are all performed during a time interval, and wherein the load continues to receive power from the electrical power bus and maintain functionality during the time interval.

16. The system of claim 15, wherein at least one of the ESSs is charged during the time interval, and wherein any substantial change in the power supplied to the load during the time interval is due to a change in power demands of the load and not due to the generating of the pre-determined signal.

17. The system of claim 12, wherein the pre-determined signal is selected from the group consisting of: a pre-determined constant current signal, a pre-determined impulse current signal, a pre-determined sinusoidal current signal, a pre-determined step current signal, and a pre-determined triangular current signal.

18. The system of claim 12, wherein each of the ESSs is an electrochemical battery pack that stores at least five kilowatt hours, and wherein the system is part of a powertrain of an electric vehicle.

19. A system comprising:
a plurality of Energy Storage Systems (ESSs) that supply current to an electrical load, wherein each of the ESSs is coupled to each of the other ESSs, and wherein charge is transferable between the ESSs; and
means for determining a value indicative of a characteristic of one of the ESSs without perturbing current supplied to the electrical load, wherein the means is coupled to a communication bus, wherein the means: (a) causes a pre-determined signal to be generated by operating a power converter such that available charge in one ESS increases and available charge in another ESS decreases and such that current is sourced or sinked between at least two of the ESSs, (b) measures a response signal output by the one of the ESSs to obtain a measured response signal, (c) processes the measured response signal to obtain an estimate of an impedance spectrum of the one of the ESSs, and (d) determines the characteristic using the estimate of the impedance spectrum, and wherein the characteristic is selected from the group consisting of: a State Of Health (SOH), and a State Of Charge (SOC).

20. The system of claim 19, wherein the means is a controller that is coupled to the one of the ESSs, and wherein the controller comprises:
a switching power converter, wherein the switching power converter and the one of the ESSs are used to generate the pre-determined current signal;
a sense circuit that measures a response signal output by the one of the ESSs; and
a processor that determines the value indicative of the characteristic of the one of the ESSs using the pre-determined current signal and the response signal.

* * * * *